United States Patent
Takagi

(10) Patent No.: US 10,103,344 B2
(45) Date of Patent: Oct. 16, 2018

(54) ORGANIC ELECTROLUMINESCENCE DISPLAY DEVICE

(71) Applicant: Japan Display Inc., Tokyo (JP)

(72) Inventor: Jun Takagi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/810,197

(22) Filed: Nov. 13, 2017

(65) Prior Publication Data

US 2018/0138436 A1   May 17, 2018

(30) Foreign Application Priority Data

Nov. 17, 2016   (JP) ................................. 2016-224017

(51) Int. Cl.
*H01L 51/50* (2006.01)
*H01L 27/32* (2006.01)

(52) U.S. Cl.
CPC ...... *H01L 51/5012* (2013.01); *H01L 27/3237* (2013.01); *H01L 27/3244* (2013.01); *H01L 51/504* (2013.01); *H01L 51/506* (2013.01); *H01L 51/508* (2013.01); *H01L 51/5044* (2013.01); *H01L 51/5048* (2013.01); *H01L 51/5052* (2013.01); *H01L 51/5056* (2013.01); *H01L 51/5064* (2013.01); *H01L 51/5068* (2013.01); *H01L 51/5072* (2013.01); *H01L 51/5076* (2013.01); *H01L 51/5084* (2013.01); *H01L 51/5092* (2013.01); *H01L 51/50* (2013.01); *H01L 51/5032* (2013.01)

(58) Field of Classification Search
None
See application file for complete search history.

(56) References Cited

U.S. PATENT DOCUMENTS

| | | | | |
|---|---|---|---|---|
| 7,255,938 B2 * | 8/2007 | Hamada | ............ | H01L 51/0052 313/504 |
| 7,898,168 B2 * | 3/2011 | Seo | ............ | H01L 51/5012 257/79 |
| 2013/0277662 A1 * | 10/2013 | Aratani | ............ | C09K 11/06 257/40 |
| 2018/0108855 A1 * | 4/2018 | Abe | ............ | H01L 51/5221 |

FOREIGN PATENT DOCUMENTS

| | | |
|---|---|---|
| JP | 2007-201198 A | 8/2007 |
| JP | 2010-226055 A | 10/2010 |
| JP | 4649676 B2 | 3/2011 |

* cited by examiner

*Primary Examiner* — Minh-Loan Tran
(74) *Attorney, Agent, or Firm* — Typha IP LLC

(57) ABSTRACT

An electroluminescence display device includes a pixel electrode; a first organic layer provided on the pixel electrode; a light emitting layer provided on the first organic layer; a second organic layer provided on the light emitting layer; and a counter electrode provided on the second organic layer. The light emitting layer includes a host material, a light emitting dopant material and an assist dopant material. The light emitting dopant material has a first concentration distribution in a thickness direction of the light emitting layer; the assist dopant material has a second concentration distribution in the thickness direction of the light emitting layer; and the first concentration distribution has a concentration peak in a range of the second concentration distribution.

6 Claims, 4 Drawing Sheets

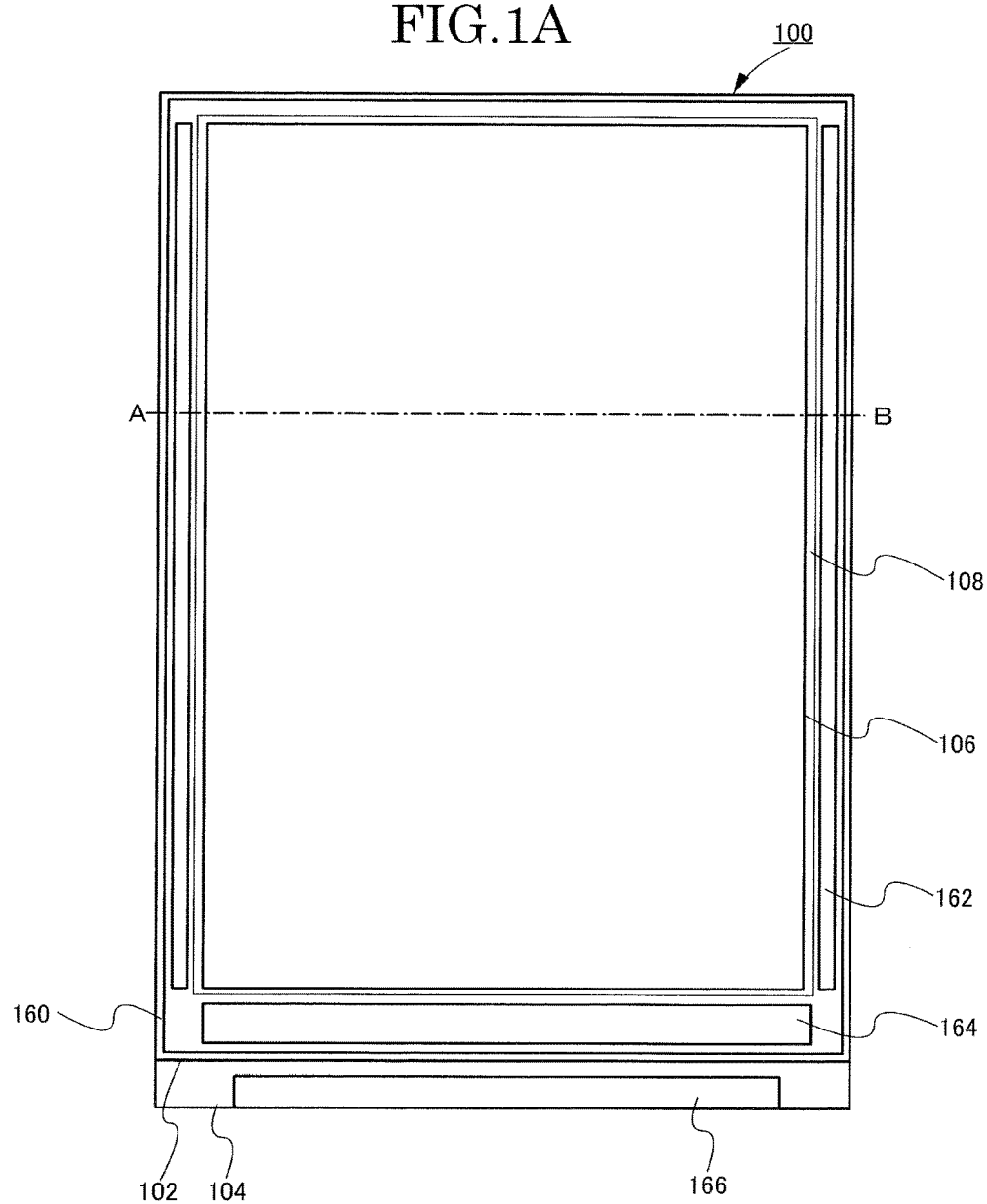
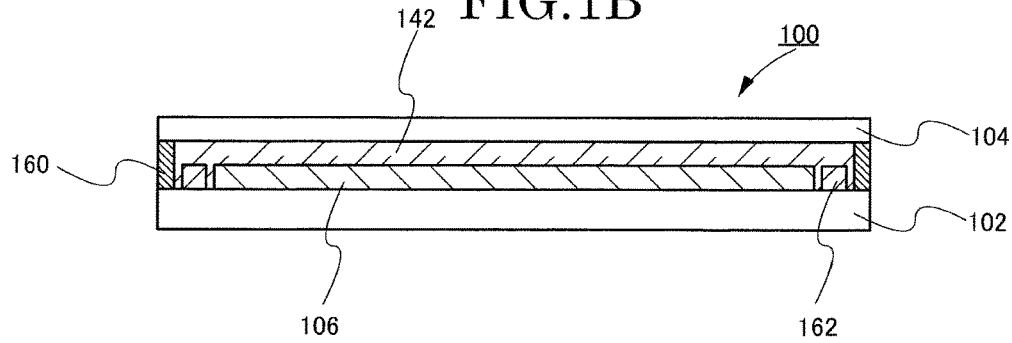

ORGANIC ELECTROLUMINESCENCE DISPLAY DEVICE

CROSS REFERENCE TO RELATED APPLICATIONS

This application is based upon and claims the benefit of priority from the prior Japanese Patent Application No. 2016-224017, filed on Nov. 17, 2016, the entire contents of which are incorporated herein by reference.

FIELD

The present invention relates to an organic electroluminescence display device (hereinafter, referred to as an "organic EL display device"), specifically, to an organic EL display device including a light emitting layer having a stabilized light emission chromaticity and having color shift being suppressed.

BACKGROUND

An organic electroluminescence element (hereinafter, also referred to as an organic EL element) includes a pair of electrodes and a thin film containing an organic electroluminescence material (hereinafter, also referred to as an "organic EL material") located between the pair of electrodes. Such an organic EL element emits light as follows. A singlet exciton, generated by recombination of a hole and an electron caused by a host molecule in the light emitting layer, causes energy transfer to a fluorescent molecule, which is a light emitting dopant. As a result, the fluorescent molecule emits light. The intensity of light emission of the organic EL element is controllable by the level of voltage to be applied or by the amount of electric current flowing in the element. A display device including a display screen that includes pixels formed by use of this characteristic has been developed.

A display device using an organic EL element is capable of displaying an image by controlling light emission of individual pixels independently. Therefore, the display device does not require a backlight unit, which is required in a transmission-type liquid crystal display device, and thus is made thinner. In such an organic EL display device, a host material is doped with a light emitting dopant to form a light emitting layer. Therefore, a technology has been reported by which the amount of the light emitting material used for the doping is set to be maximized at a peak emission position at which the density of holes and electron is highest in a thickness direction of the light emitting layer, from the point of view of improving the light emission efficiency of, and extending the life of, the organic EL display device (Japanese Laid-Open Patent Publication No. 2007-201198).

Japanese Patent No. 4649676 describes that a region doped with a dopant providing an electron injection characteristic and/or an electron transfer characteristic includes, arranged in a thickness direction, an organic dopant region doped with an organic dopant and a metal dopant region doped with a metal dopant, and that the organic dopant region is located between a light emitting region doped with a dopant providing a light emitting characteristic and the metal dopant region. Japanese Patent No. 4649676 also describes that the light emitting region partially overlaps at least one of a hole dopant region and an electron dopant region in the thickness direction. Japanese Laid-Open Patent Publication No. 2010-226055 describes an EL organic display device including a first organic EL element including an organic layer, containing a first dopant material, between a pixel electrode and a counter electrode; and a second organic EL element including an organic layer, extending from the first organic EL element, between the pixel electrode and the counter electrode, the organic layer containing a second dopant material that is an isomer of the first dopant material.

SUMMARY

An embodiment according to the present invention provides an electroluminescence display device including a pixel electrode; a first organic layer provided on the pixel electrode; a light emitting layer provided on the first organic layer; a second organic layer provided on the light emitting layer; and a counter electrode provided on the second organic layer. The light emitting layer includes a host material, a light emitting dopant material and an assist dopant material. The light emitting dopant material has a first concentration distribution in a thickness direction of the light emitting layer; the assist dopant material has a second concentration distribution in the thickness direction of the light emitting layer; and the first concentration distribution has a concentration peak in a range of the second concentration distribution.

BRIEF EXPLANATION OF THE DRAWINGS

FIG. 1A is a plan view and a sectional view showing a production method of an electroluminescence display device according to an embodiment of the present invention;

FIG. 1B is a plan view and a sectional view showing a production method of an electroluminescence display device according to an embodiment of the present invention;

DESCRIPTION OF EMBODIMENTS

Figure 2:
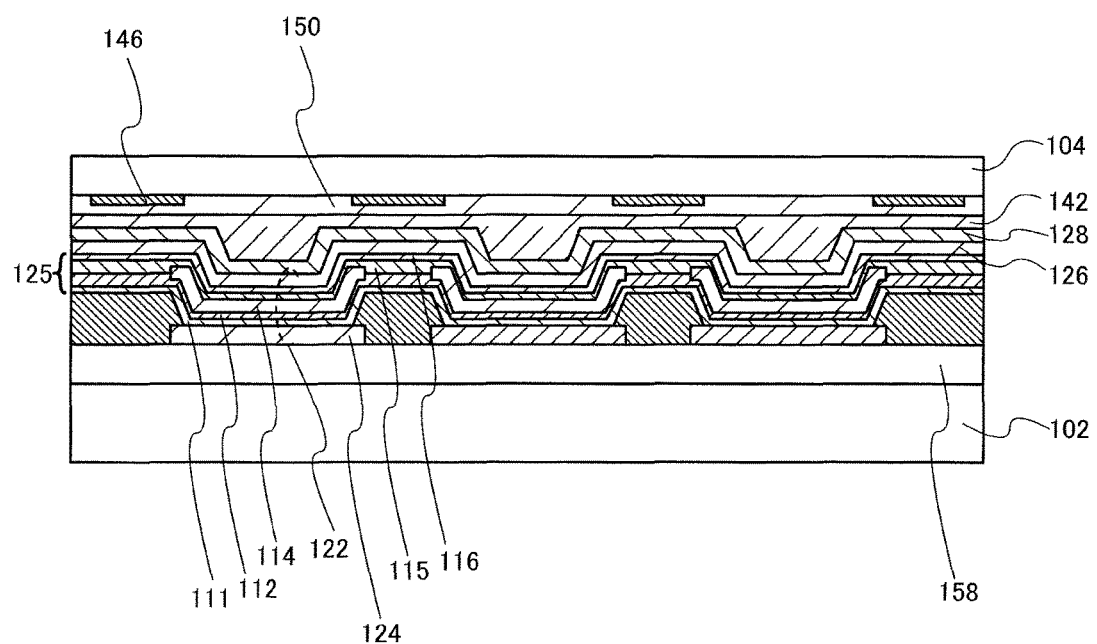
FIG. 2 is a sectional view showing the arrangement of an organic EL element 122 in a pixel unit 106 according to an embodiment of the present invention.

Embodiments of the present invention will be described below with reference to the accompanying drawings and the like. Note, however, that the present invention can be carried out in many different modes and should not be interpreted by only the written contents of embodiments exemplified below. In addition, for the sake of clearer explanation, the drawings sometimes show each portion more schematically than in actual modes in terms of width, thickness, shape, and the like. However, each drawing shows merely an example and should not limit the interpretation of the present invention. Furthermore, in this specification and the drawings, the same reference numerals denote the same elements as those described with reference to preceding drawings, and a detailed description will be appropriately omitted.

In this specification, a case in which a given member or region is located "on (or under)" another member or region includes not only a case in which a given member or region is located immediately above (or immediately below) another member or region but also a case in which a given member or region is located above (or below) another member of region, unless otherwise specified. That is, this case also includes a case in which another constituent element is located above (or below) another member or region so as to be included between a given member or region and another member or region.

In an organic EL display device that emits light merely by singlet excitons, singlet excitons generated by recombination of holes and electrons in a light emitting layer occupy 25% of all the excitons, and the remaining 75% of the excitons are triplet excitons. The triplet excitons do not contribute to light emission because of heat deactivation. By contrast, in an organic EL display device that emits light merely by triplet excitons, singlet excitons, which occupy 25% of all the excitons, do not contribute to light emission because of heat deactivation.

Recently, a technology has been reported by which a triplet exciton is converted into a singlet exciton to dope the light emitting layer with a light emitting dopant and also an assist dopant capable of performing energy transfer of a singlet exciton to a fluorescent molecule. Theoretically, triplet excitons are mostly convertible into singlet excitons by use of the assist dopant. Therefore, a highly efficient organic EL display device is expected to be realized.

Triplet excitons are mostly convertible into singlet excitons by use of the assist dopant theoretically. However, unless the energy transfer to the light emitting dopant is performed at a sufficiently high efficiency, the efficiency of the organic EL display device is not improved. If the light emitting positions are widely distributed in the thickness direction of the light emitting layer, color shift occurs. In the case where the entirety of the light emitting layer is doped with the light emitting dopant, the light emitting dopant not located at a light emitting position does not contribute to light emission and the light emitting efficiency is not improved although the amount of the light emitting dopant used to dope the light emitting material is increased.

In light of these problems, the present invention has an object of providing an organic EL display device in which the light emitting positions in the light emitting layer are controlled to stabilize light emission chromaticity, so that the efficiency of energy transfer of a dopant is improved and color shift is suppressed.

<Structure of the Organic EL Display Device>

FIG. 1A and FIG. 1B show a structure of an organic EL display device 100 according to an embodiment of the present invention. FIG. 1A is a plan view of the organic EL display device 100. FIG. 1B shows a cross-sectional structure of the organic display device 100 taken along line A-B in FIG. 1A.

The organic EL display device 100 includes a pixel unit 106 including a plurality of pixels 120 (see FIG. 4) arrayed two-dimensionally. The pixel unit 106 is provided on a first substrate 102. The first substrate 102 may have a scanning line driving circuit 162, a video signal line driving circuit 164, an input terminal portion 166 and the like provided thereon. A second substrate 104 faces the first substrate 102, and is provided so as to seal the pixel unit 106.

The second substrate 104 and the first substrate 102 are secured to each other by a sealing member 160. The second substrate 104 and the first substrate 102 are secured to each other while having a gap of several micrometers to several ten micrometers therebetween. The gap is filled with a filler member 142. The filling member 142 is preferably formed of a resin material. A structure in which the pixel unit 106 is located between the second substrate 104 and the first substrate 102, and the gap between the second substrate 104 and the first substrate 102 is filled with the filling member 142 is referred to as a "solid sealing structure". The second substrate 104 and the first substrate 102 may be secured to each other by the filling member 142, with no use of the sealing member 160. In the case where the pixel unit (display region) 106 is protected merely by the filling member 142 in a preferable manner, the second substrate 104 does not need to be provided.

Figure 3A:
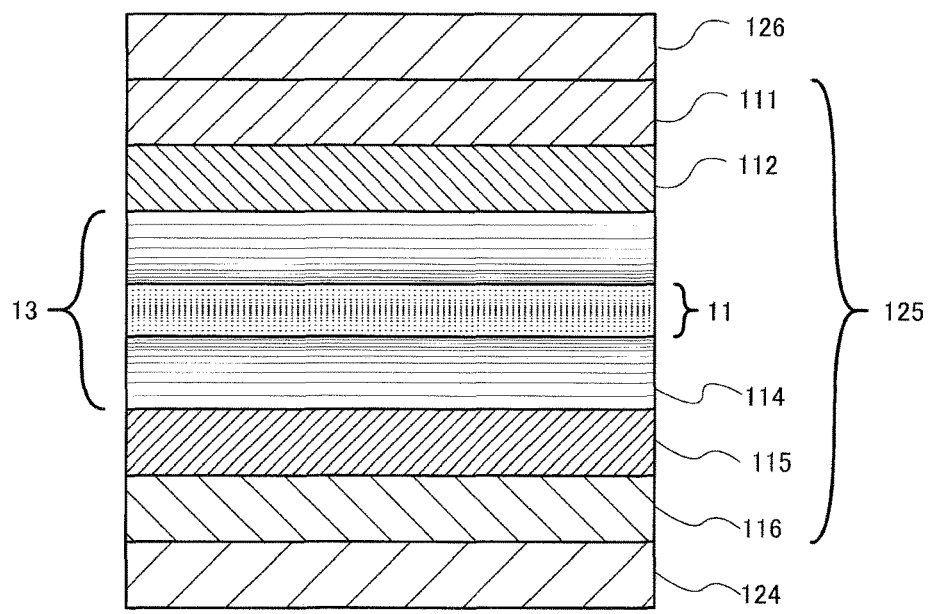
FIG. 3A is a sectional view showing the arrangement of an organic EL element according to an embodiment of the present invention.
Figure 3B:
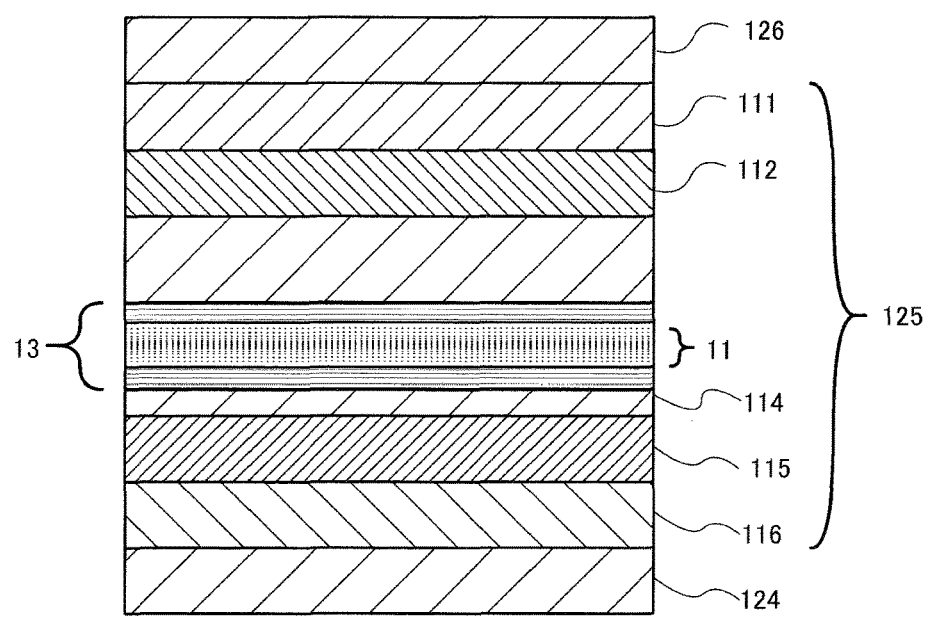
FIG. 3B is a sectional view showing the arrangement of an organic EL element according to an embodiment of the present invention.

The pixels 120 in the pixel unit 106 each include an organic EL element 122 (see FIG. 3A, FIG. 3B, etc.). The organic EL element 122 includes an organic light emitting layer 114, which contains a host material commonly used, and an organic EL display device material according to the present invention. The pixels 120 in the pixel unit 106 are each controlled by a pixel circuit independently regarding light emission. A signal controlling light emission of each pixel 120 is supplied by the scanning line driving circuit 162 and the video signal line driving circuit 164.

The organic EL display device 100 shown in FIG. 1A and FIG. 1B is of a top emission structure, in which light emitted from the pixel unit 106 is output toward the second substrate 104.

In such a top emission-type organic EL display device, the second substrate 104 needs to be light-transmissive. Therefore, the second substrate 104 is formed of glass or a resin material. A highly light-transmissive resin material is preferably selected from the group consisting of, for example, polybenzoxazole, polyamideimide having an alicyclic structure, polyimide having an alicyclic structure, polyamide, and poly(p-xylylene). A single material selected from these resin materials may be used, or a combination of a plurality of materials among these resin materials may be used. In the case of being formed of, for example, a polyimide resin, the second substrate 104 may be formed as follows. A solution containing polyamic acid (encompassing partially imidized polyamic acid), which is a precursor of polyimide, or a solution containing soluble polyimide, is applied to a support substrate and sintered.

Figure 4:
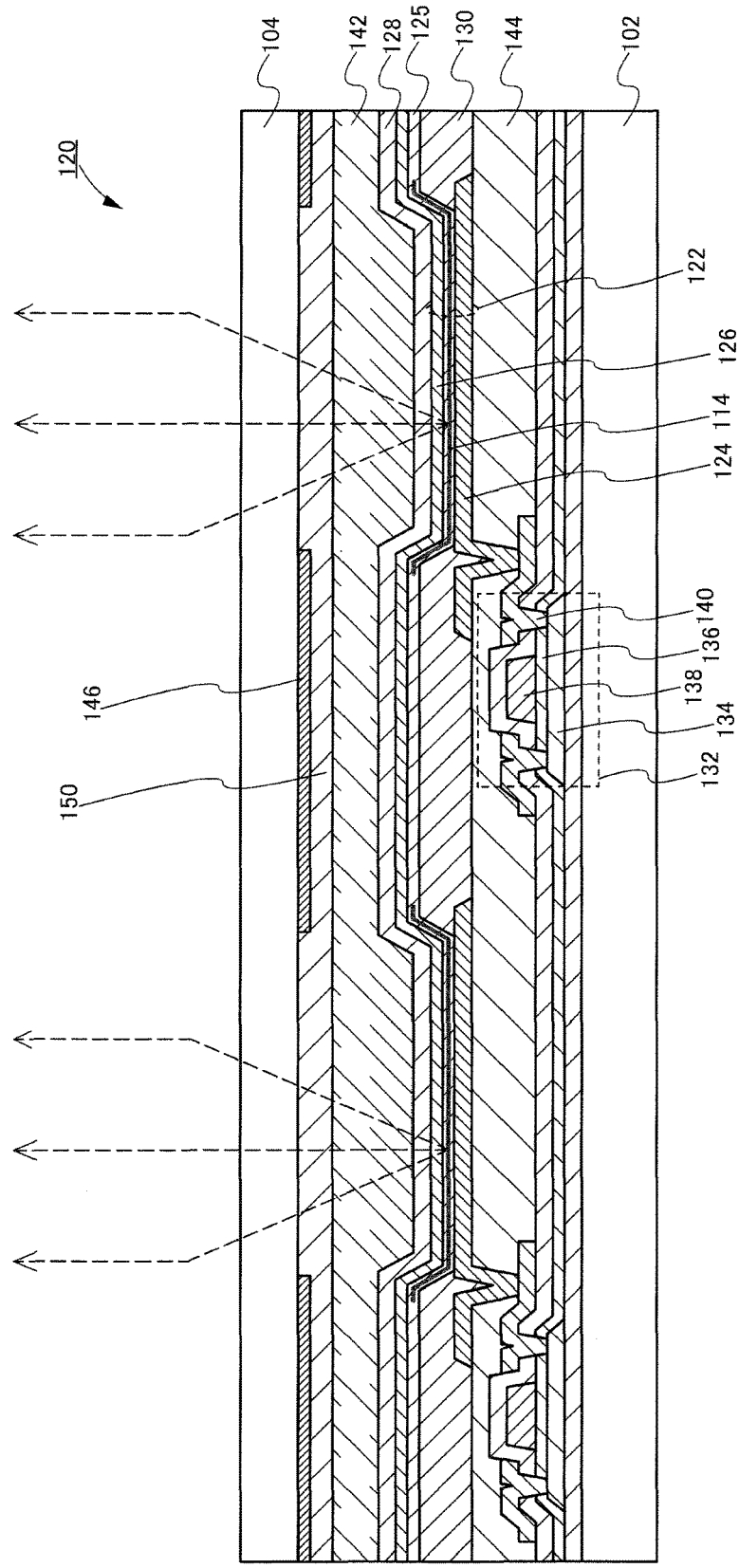
FIG. 4 is a sectional view showing the arrangement of a pixel 120 in the pixel unit 106 according to an embodiment of the present invention.

With reference to FIG. 2 and FIG. 4, a structure of the pixel unit 106 will be described. FIG. 2 is a sectional view showing the organic EL element 122 in the pixel unit 106. FIG. 4 is a sectional view showing a structure of the pixel 120 in the pixel unit 106. The organic EL element 122 includes a pixel electrode (first electrode layer) 124, an organic EL layer 125 stacked on the pixel electrode 124, and a counter electrode (second electrode layer) 126 stacked on the organic EL layer 125. The organic EL layer 125 may be formed of a low molecular weight type organic material or a high molecular weight type organic material. The organic EL layer 125 includes the organic light emitting layer 114 including a host material, a light emitting dopant material and an assist dopant material, and also includes a first organic layer 111 and a second organic layer 116 having the organic light emitting layer 114 therebetween. Although not shown, the first organic layer 111 includes a hole transfer layer, and the second organic layer 116 includes an electron transfer layer. It is preferred that the first organic layer 111 is thicker than the second organic layer 116.

In each organic EL element 122, the organic EL layer 125 may emit light of red (R), green (G) or blue (B), or may emit so-called white light. In the case where the organic EL layer 125 emits light of red (R), green (G) or blue (B) in each organic EL element 122, the light emitting dopant material emitting light of each color and the assist dopant material corresponding to the light emitting dopant material are provided in the pixels 120 corresponding to the each color. Thus, the organic EL layer 125 is formed. In FIG. 2, the first organic layer 111 and the second organic layer 116 are continuously provided across a plurality of adjacent pixels. The organic EL display device 100 is not limited to having such a structure. The first organic layer 111 and the second organic layer 116 may be individually provided in each pixel 120, like the organic light emitting layer 114.

In an embodiment, the organic EL layer 125 may further include an electron blocking layer 112 between the first organic layer 111 and the organic light emitting layer 114, and may further include a hole blocking layer 115 between the organic light emitting layer 114 and the second organic layer 116. Although not shown, the first organic layer 111 may include a hole injection layer between the pixel electrode 124 and the hole transfer layer. The second organic layer 116 may include an electron injection layer between the counter electrode 126 and the electron transfer layer.

In this embodiment, the first organic layer 111, the organic light emitting layer 114, the second organic layer 116, the electron blocking layer 112, and the hole blocking layer 115 may each be formed of a known material.

A hole transfer-type material usable for the first organic layer 111 is, for example, at least one selected from the group consisting of heterocyclic conjugated monomers, oligomers, polymers, and the like such as benzidine or a derivative thereof, styrylamine or a derivative thereof, triphenylmethane or a derivative thereof, porphyrin or a derivative thereof, triazole or a derivative thereof, imidazole or a derivative thereof, oxadiazole or a derivative thereof, polyarylalkane or a derivative thereof, phenylenediamine or a derivative thereof, arylamine or a derivative thereof, oxazole or a derivative thereof, anthracene or a derivative thereof, fluorenone or a derivative thereof, hydrazone or a derivative thereof, stilbene or a derivative thereof, phthalocyanine or a derivative thereof, a polysilane-based compound, a vinylcarbazole-based compound, a thiophene-based compound, an aniline-based compound, and the like. The hole transfer layer and the hole injection layer may be formed of a material selected from these materials.

Such a hole transfer-type material may be, for example, at least one selected from the group consisting of α-nathtyl-phenyldiamine (αNPD), porphyrin, metal-tetraphenylporphyrin, metal-naphthalocyanine, 4,4',4"-trimethyltriphenylamine, 4,4',4"-tris(3-methylphenylphenylamino) triphenylamine (m-MTDATA), N,N,N',N'-tetrakis(p-tolyl) p-phenylenediamine, N,N,N',N'-tetraphenyl-4,4'-diaminobiphenyl, N-phenylcarbazole, 4-di-p-tolylaminostilbene, poly(paraphenylenevinylene), poly (thiophenevinylene), poly(2,2'-thienylpyrrol), and the like. The hole transfer-type material is not limited to any of the above.

A material usable for the electron blocking layer 112 may be, for example, HTEB02 or HTEB04 produced by Kanto Chemical Co., Inc.

An electron transfer-type material usable for the second organic layer 116 is, for example, at least one selected from the group consisting of 8-hydroxyquinolinealuminum (Alq3), 8-hydroxymethylquinolinealuminum, anthracene, naphthalene, phenanthrene, pyrene, chrysene, perylene, butadiene, coumarin, acridine, stilbene, derivatives thereof, and the like. The electron transfer-type material is not limited to any of the above. The electron transfer layer and the electron injection layer may be formed of a material selected from these materials.

A material usable for the hole blocking layer 115 may be, for example, 4,4'-N,N'-dicarbozole-biphenyl (CBP) or 2,9-dimethyl-4,7-diphenyl-1,10-phenanthroline.

The organic light emitting layer 114 is formed of a combination of required host materials appropriately selected from the above-described hole transfer-type materials, the above-described electron transfer-type materials, and materials capable of transferring both of holes and electrons, and may further contain a light emitting dopant material and an assist dopant material in accordance with the color of the corresponding pixel. The host material, the light emitting dopant material and the assist dopant material may each be a known material.

The light emitting dopant material may be, for example, a compound represented by any of chemical formulas (1) through (5) below, but is not limited to any of these.

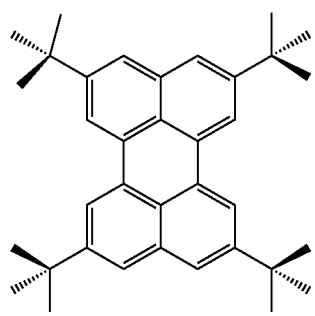

(1)

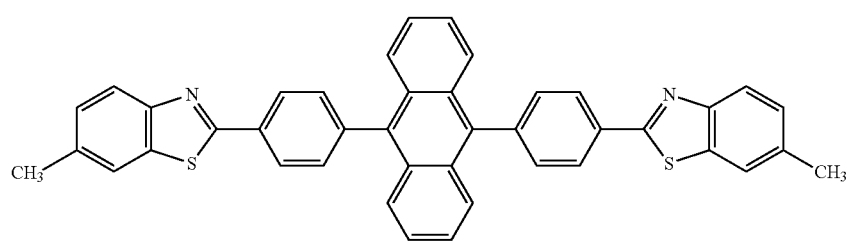

(2)

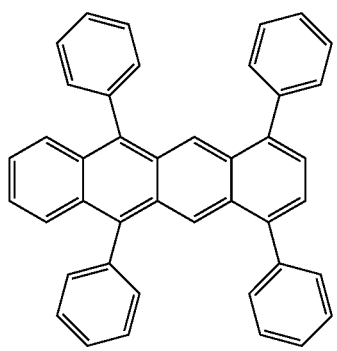

(3)

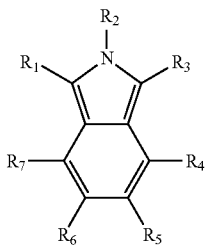

(4)

(5)

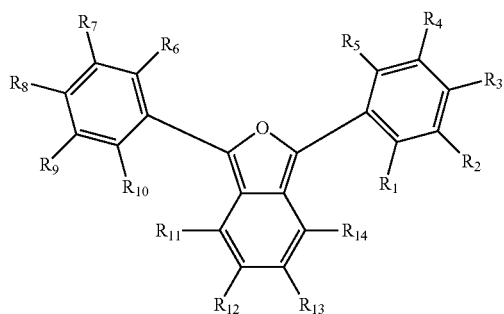

In chemical formula (4) above, $R^1$ through $R^7$ are each selected from the group consisting of hydrogen, an alkyl group, a cycloalkyl group, an aralkyl group, an alkenyl group, a cycloalkenyl group, an alkynyl group, a hydroxy group, a mercapto group, an alkoxy group, an alkylthio group, an arylether group, an arylthioether group, an aryl group, a heterocyclic group, halogen, haloalkane, haloalkene, haloalkyne, a cyano group, an aldehyde group, a carbonyl group, a carboxyl group, an ester group, a carbamoyl group, an amino group, a nitro group, a silyl group, and a siloxanyl group. $R^1$ through $R^7$ may each form a ring structure together with a substituent adjacent thereto.

In chemical formula (4), the alkyl group indicates a saturated aliphatic hydrocarbon group such as, for example, a methyl group, an ethyl group, a propyl group, a butyl group, or the like. Such a group may be unsubstituted or substituted. The cycloalkyl group indicates a saturated alicyclic hydrocarbon group selected from the group consisting of, for example, cyclopropyl, cyclohexyl, norbornyl, adamantyl, and the like. Such a group may be unsubstituted or substituted. The aralkyl group indicates an aromatic hydrocarbon group, via an aliphatic hydrocarbon group, selected from the group consisting of, for example, a benzyl group, a phenylethyl group, and the like. Both of the aliphatic hydrocarbon group and the aromatic hydrocarbon group may be unsubstituted or substituted. The alkenyl group indicates an unsaturated aliphatic hydrocarbon group, containing a double bond, selected from the group consisting of, for example, a vinyl group, an allyl group, a butadiene group, and the like. Such a group may be unsubstituted or substituted. The cycloalkenyl group indicates an unsaturated alicyclic hydrocarbon group, containing a double bond, selected from the group consisting of, for example, a cyclopentenyl group, a cyclopentadienyl group, a cyclohexenyl group, and the like. Such a group may be unsubstituted or substituted. The alkynyl group indicates an unsaturated aliphatic hydrocarbon group, containing a triple bond, such as, for example, an acetylenyl group or the like. Such a group may be unsubstituted or substituted.

The alkoxy group indicates an aliphatic hydrocarbon group, via an ether bond, such as, for example, a methoxy group or the like. The aliphatic hydrocarbon group may be unsubstituted or substituted. The alkylthio group is obtained as a result of an oxygen atom of the ether bond of the alkoxy group being substituted with a sulfur atom. The arylether group indicates an aromatic hydrocarbon group, via an ether bond, such as, for example, a phenoxy group or the like. The aromatic hydrocarbon group may be unsubstituted or substituted. The arylthioether group is obtained as a result of an oxygen atom of the ether bond of the arylether group being substituted with a sulfur atom. The aryl group indicates an aromatic hydrocarbon group selected from the group consisting of, for example, a phenyl group, a naphthyl group, a biphenyl group, a phenanthryl group, a terphenyl group, a pyrenyl group, and the like. Such a group may be unsubstituted or substituted. The heterocyclic group indicates a ring-structured group, containing an atom other than a carbon atom, selected from the group consisting of, for example, a furyl group, a thienyl group, an oxazolyl group, a pyridyl group, a quinolyl group, a carbazolyl group, and the like. Such a group may be unsubstituted or substituted. The halogen indicates an element selected from the group consisting of fluorine, chlorine, bromine, and iodine.

The haloalkane, the haloalkene and the haloalkyne are respectively obtained as a result of the alkyl group, the alkenyl group and the alkynyl group described above being substituted with the halogen partially or entirely, and are, for example, a trifluoromethyl group or the like. The remaining part may be unsubstituted or substituted. The aldehyde group, the carbonyl group, the ester group, the carbamoyl group, and the amino group may each encompass a group substituted with at least one substituent selected from the group consisting of an aliphatic hydrocarbon group, an alicyclic hydrocarbon group, an aromatic hydrocarbon group, and a heterocyclic group. The aliphatic hydrocarbon group, the alicyclic hydrocarbon group, the aromatic hydrocarbon group and the heterocyclic group may each be unsubstituted or substituted. The silyl group indicates a silicon compound group such as, for example, a trimethylsilyl group or the like. Such a group may be unsubstituted or substituted. The siloxanyl group indicates a silicon compound group, via an ether bond, such as, for example, a trimethylsiloxanyl group or the like. Such a group may be unsubstituted or substituted. The above-described groups may each form a ring structure together with a substituent adjacent thereto. The ring structure thus formed may be unsubstituted or substituted.

In chemical formula (5) above, $R^1$ through $R^{14}$ may be the same as, or different from, each other. $R^1$ through $R^{14}$ are each selected from the group consisting of hydrogen, an alkyl group, a cycloalkyl group, an aralkyl group, an alkenyl group, a cycloalkenyl group, an alkynyl group, an alkoxy group, an alkylthio group, an arylether group, an arylthioether group, an aryl group, a heterocyclic group, halogen, haloalkane, an amino group, a silyl group, or a siloxanyl group, and a condensed cyclic group formed between substituents adjacent thereto, a heterocyclic group and an alicyclic group.

Among these substituents, the alkyl group indicates a saturated aliphatic hydrocarbon group selected from the group consisting of, for example, a methyl group, an ethyl group, a propyl group, a butyl group, and the like. Such a group may be unsubstituted or substituted. The cycloalkyl group indicates a saturated alicyclic hydrocarbon group selected from the group consisting of, for example, cyclopropyl, cyclohexyl, norbornyl, adamantyl, and the like. Such a group may be unsubstituted or substituted. The aralkyl group indicates an aromatic hydrocarbon group, via an aliphatic hydrocarbon group, selected from the group consisting of, for example, a benzyl group, a phenylethyl group, and the like. Both of the aliphatic hydrocarbon group and the aromatic hydrocarbon group may be unsubstituted or substituted. The alkenyl group indicates an unsaturated aliphatic hydrocarbon group, containing a double bond, such as, for example, a vinyl group, an allyl group, a butadiene group, or the like. Such a group may be unsubstituted or substituted. The cycloalkenyl group indicates an unsaturated alicyclic hydrocarbon group, containing a double bond, selected from the group consisting of, for example, a cyclopentenyl group, a cyclopentadienyl group, and a cyclohexenyl group. Such a group may be unsubstituted or substituted. The alkynyl group indicates an unsaturated aliphatic hydrocarbon group, containing a triple bond, such as, for example, an acetylenyl group or the like. Such a group may be unsubstituted or substituted. The alkoxy group indicates an aliphatic hydrocarbon group, via an ether bond, such as, for example, a methoxy group or the like. The aliphatic hydrocarbon group may be unsubstituted or substituted. The alkylthio group is obtained as a result of an oxygen atom of the ether bond of the alkoxy group being substituted with a sulfur atom. The arylether group indicates an aromatic hydrocarbon group, via an ether bond, such as, for example, a phenoxy group or the like. The aromatic hydrocarbon group may be unsubstituted or substituted. The arylthioether group is obtained as a result of an oxygen atom of the ether bond of the arylether group being substituted with a sulfur atom. The aryl group indicates an aromatic hydrocarbon group selected from the group consisting of, for example, a phenyl group, a naphthyl group, a biphenyl group, a phenanthryl group, a terphenyl group, a pyrenyl group, and the like. Such a group may be unsubstituted or substituted. The heterocyclic group indicates a ring-structured group, containing an atom other than a carbon atom, such as, for example, a furanyl group, a thiophenyl group, an oxazolyl group, a pyridyl group, a quinolinyl group, a carbazolyl group, and the like. Such a group may be unsubstituted or substituted. The halogen indicates an element selected from the group consisting of fluorine, chlorine, bromine, and iodine. The haloalkane, the haloalkene and the haloalkyne are respectively obtained as a result of the alkyl group, the alkenyl group and the alkynyl group described above being substituted with the halogen partially or entirely, and are, for example, a trifluoromethyl group. The remaining part may be unsubstituted or substituted. The aldehyde group, the carbonyl group, the ester group, the carbamoyl group, and the amino group may each encompass a group substituted with a substituent selected from the group consisting of an aliphatic hydrocarbon group, an alicyclic hydrocarbon group, an aromatic hydrocarbon group, a heterocyclic group, and the like. The aliphatic hydrocarbon group, the alicyclic hydrocarbon group, the aromatic hydrocarbon group and the heterocyclic group may each be unsubstituted or substituted. The silyl group indicates a silicon compound group such as, for example, a trimethylsilyl group or the like. Such a group may be unsubstituted or substituted. The siloxanyl group indicates a silicon compound group, via an ether bond, such as, for example, a trimethylsiloxanyl group or the like. Such a group may be unsubstituted or substituted.

The assist dopant material may be preferably a compound represented by any of general formulas (6) through (23) below, but is not limited to any of these.

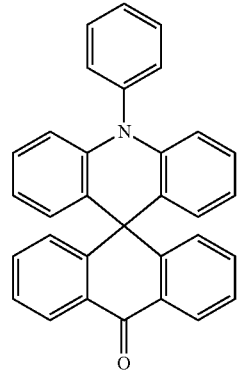

(6)

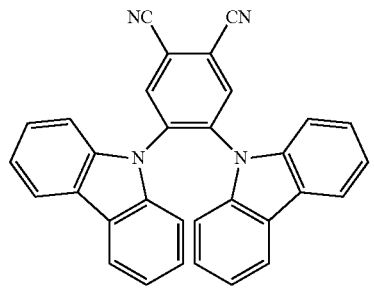

(7)

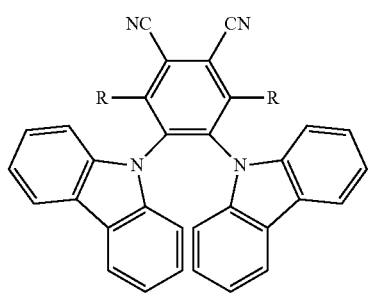
(8)
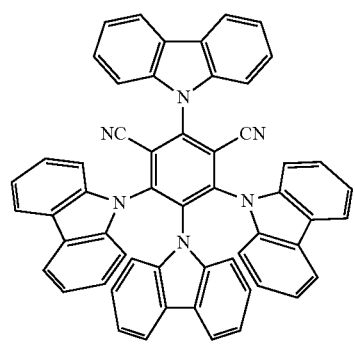
(9)
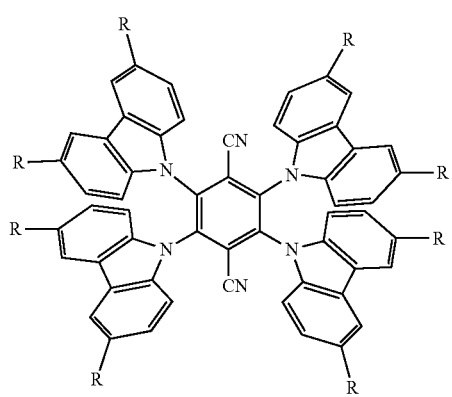
(10)
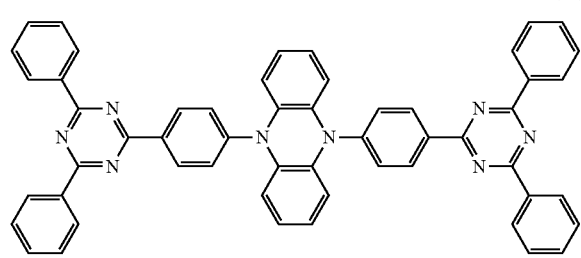
(11)
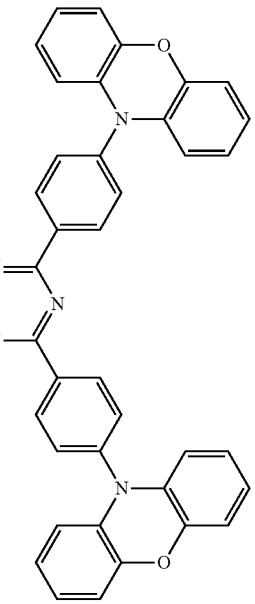
(12)
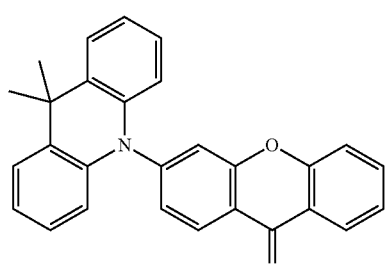
(13)
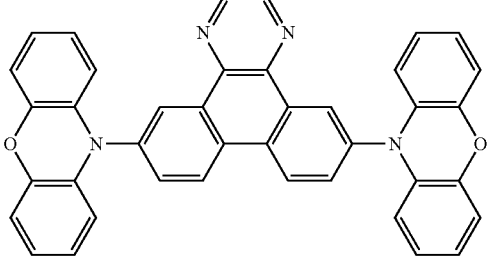
(14)
(15)

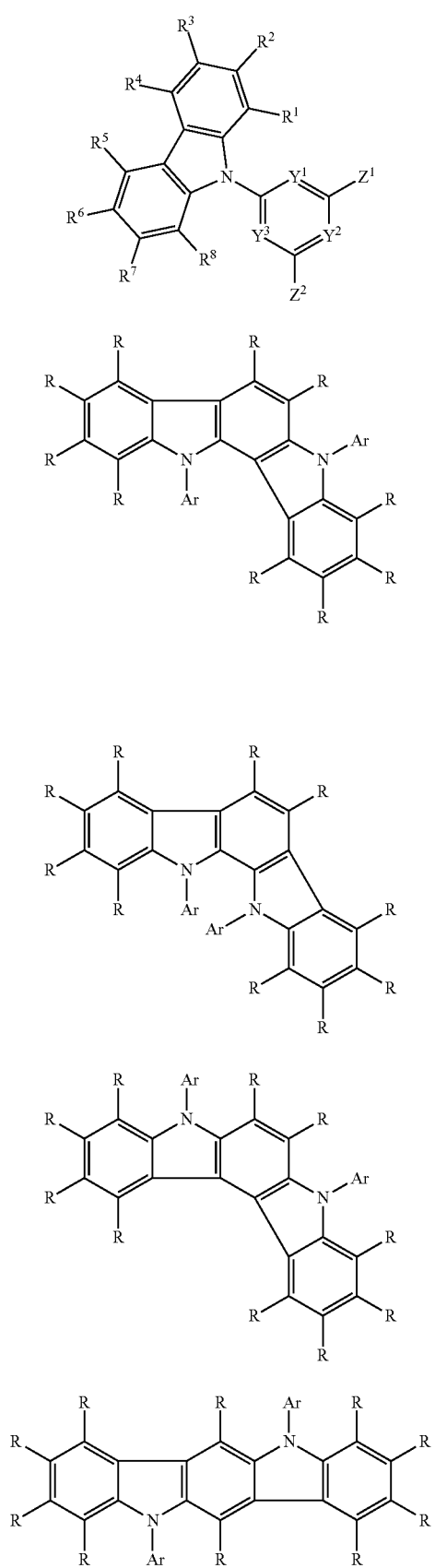

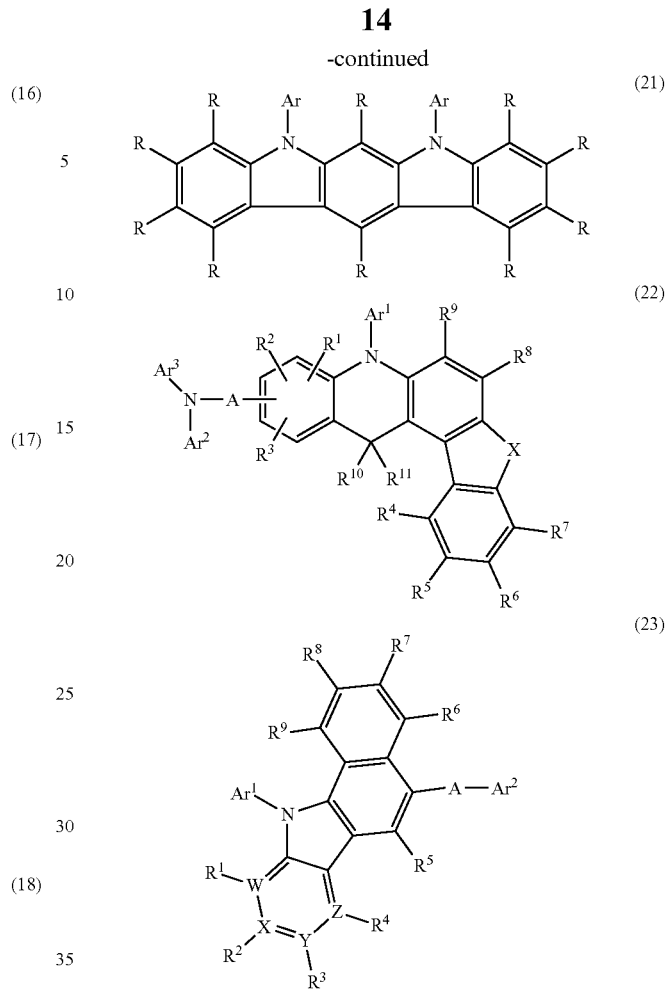

In chemical formula (8), R is a hydrogen atom or a carbazolyl group. In chemical formula (10), R is a hydrogen atom, a methyl group or a phenyl group. In chemical formula (16), R is a hydrogen atom, a methyl group or a phenyl group. Regarding $Y^1$, $Y^2$ and $Y^3$, $Y^2$ and $Y^3$ each represent a nitrogen atom and $Y^1$ represents a methine group, or all of $Y^1$, $Y^2$ and $Y^3$ each represent a nitrogen atom. $Z^1$ and $Z^2$ each represent a hydrogen atom or a substituent independently. In the case where $Y^2$ and $Y^3$ are each a nitrogen atom and $Y^1$ is a methine group, $Z^2$ represents a hydrogen atom, a substituted or unsubstituted alkyl group, or a substituted or unsubstituted aryl group. $R^1$ through $R^8$ each represent a hydrogen atom or a substituent independently. At least one of $R^1$ through $R^8$ represents a substituted or unsubstituted diarylamino group or a substituted or unsubstituted carbazolyl group. In the case where all of $Y^1$, $Y^2$ and $Y^3$ are each a nitrogen atom, at least one of $R^1$ through $R^8$ represents a substituted or unsubstituted diarylamino group or a substituted or unsubstituted 9-carbazolyl group, and contains at least two carbazolyl structures.

In chemical formula (16), $Z^1$ and $Z^2$ each represent a hydrogen atom or a substituent independently. A preferable substituent represented by each of $Z^1$ and $Z^2$ is selected from the group consisting of an alkyl group having a carbon number of 1 through 20, an alkoxy group having a carbon number of 1 through 20, an alkylthio group having a carbon number of 1 through 20, an alkyl-substituted amino group having a carbon number of 1 through 20, an acyl group having a carbon number of 2 through 20, an aryl group having a carbon number of 6 through 40, a heteroaryl group having a carbon number of 3 through 40, a diarylamino group having a carbon number of 12 through 40, a substituted or unsubstituted carbazolyl group having a carbon number of 12 through 40, an alkenyl group having a carbon number of 2 through 10, an alkynyl group having a carbon number of 2 through 10, an alkoxycarbonyl group having a carbon number of 2 through 10, an alkylsulfonyl group having a carbon number of 1 through 10, a haloalkyl group having a carbon number of 1 through 10, an amide group, an alkylamide group having a carbon number of 2 through 10, a trialkylsilyl group having a carbon number of 3 through 20, a trialkylsilylalkyl group having a carbon number of 4 through 20, a trialkylsilylalkenyl group having a carbon number of 5 through 20, a trialkylsilylalkynyl group having a carbon number of 5 through 20, a cyano group, a nitro group, a hydroxy group, and the like. Such a group may be further substituted with a substituent. More preferably, $Z^1$ and $Z^2$ are each independently selected from the group consisting of a hydrogen atom, a substituted or unsubstituted alkyl group having a carbon number of 1 through 20, a substituted or unsubstituted aryl group having a carbon number of 6 through 40, a substituted or unsubstituted heteroaryl group having a carbon number of 3 through 40, a substituted or unsubstituted diarylamino group having a carbon number of 12 through 40, and a substituted or unsubstituted carbazolyl group having a carbon number of 12 through 40. Still more preferably, $Z^1$ and $Z^2$ are each independently selected from the group consisting of a hydrogen atom, a substituted or unsubstituted alkyl group having a carbon number of 1 through 10, a substituted or unsubstituted aryl group having a carbon number of 6 through 15, a substituted or unsubstituted heteroaryl group having a carbon number of 3 through 12, and a substituted or unsubstituted 9-carbazolyl group having a carbon number of 12 through 24. Still more preferably, $Z^1$ is selected from the group consisting of a substituted or unsubstituted aryl group having a carbon number of 6 through 15, a substituted or unsubstituted heteroaryl group having a carbon number of 3 through 12, and a substituted or unsubstituted 9-carbazolyl group having a carbon number of 12 through 24. Still more preferably, $Z^2$ is selected from the group consisting of a hydrogen atom, a substituted or unsubstituted alkyl group having a carbon number of 1 through 10, a substituted or unsubstituted aryl group having a carbon number of 6 through 15, and a substituted or unsubstituted heteroaryl group having a carbon number of 3 through 12.

The alkyl group may be straight-chained, branched or ring-shaped. More preferably, the alkyl group has a carbon number of 1 through 6. A specific example of the alkyl group is selected from the group consisting of a methyl group, an ethyl group, a propyl group, a butyl group, a t-butyl group, a pentyl group, a hexyl group, and an isopropyl group. The aryl group may be of a single ring or a fused ring. A specific example of the aryl group is a phenyl group or a naphthyl group. The heteroaryl group may also be of a single ring or a fused ring. A specific example of the heteroaryl group is selected from the group consisting of a pyridyl group, a pyridazyl group, a pyrimidyl group, a triazyl group, a triazolyl group, and a benzotriazolyl group. Such a heteroaryl group may be obtained as a result of bonding via a hetero atom, but preferably is obtained as a result of boding via a carbon atom forming a heteroaryl ring. In the case where the 9-carbazolyl group is substituted, it is preferred that the 9-carbazolyl group is substituted with a substituent selected from the group consisting of an alkyl group, an aryl group, a heteroaryl group, a cyano group, a diarylamino group and a carbazolyl group described above.

In general formula (16), $R^1$ through $R^8$ each represents a hydrogen atom or a substituent independently. A preferable substituent represented by each of $R^1$ through $R^8$ is selected from the group consisting of an alkyl group having a carbon number of 1 through 20, an aralkyl group having a carbon number of 7 through 20, an alkenyl group having a carbon number of 2 through 20, an alkynyl group having a carbon number of 2 through 20, an aryl group having a carbon number of 6 through 30, a heteroaryl group having a carbon number of 3 through 30, a cyano group, a dialkylamino group having a carbon number of 2 through 20, a diarylamino group having a carbon number of 12 through 30, a carbazolyl group having a carbon number of 12 through 30, a diaralkylamino group having a carbon number of 12 through 30, an amino group, a nitro group, an acyl group having a carbon number 2 through 20, an alkoxycarbonyl group having a carbon number of 2 through 20, an alkoxy group having a carbon number of 1 through 20, an alkylsulfonyl group having a carbon number of 1 through 20, a hydroxy group, an amide group, a haloalkyl group having a carbon number of 1 through 10, an alkylamide group having a carbon number of 2 through 10, a trialkylsilyl having a carbon number of 3 through 20, a trialkylsilylalkyl group having a carbon number of 4 through 20, a trialkylsilylalkenyl group having a carbon number of 5 through 20, and a trialkylsilylalkynyl group having a carbon number of 5 through 20. Such a group may be further substituted with a substituent. More preferably, $R^1$ through $R^8$ are each independently selected from the group consisting of a hydrogen atom, a substituted or unsubstituted alkyl group having a carbon number of 1 through 20, a substituted or unsubstituted aryl group having a ring-forming carbon number of 6 through 30, a substituted or unsubstituted heteroaryl group having a ring-forming carbon number of 3 through 30, a substituted or unsubstituted diarylamino group having a ring-forming carbon number of 12 through 30, and a carbazolyl group having a ring-forming carbon number of 12 through 30. Still more preferably, $R^1$ through $R^8$ are each independently selected from the group consisting of a hydrogen atom, a substituted or unsubstituted alkyl group having a carbon number of 1 through 10, a substituted or unsubstituted aryl group having a ring-forming carbon number of 6 through 15, a substituted or unsubstituted heteroaryl group having a ring-forming carbon number of 3 through 12, a substituted or unsubstituted diphenylamino group having a ring-forming carbon number of 12 through 24, and a carbazolyl group having a ring-forming carbon number of 12 through 24.

In general formula (16), at least one of $R^1$ through $R^8$ is a substituted or unsubstituted diarylamino group or a substituted or unsubstituted carbazolyl group. A specific example of the carbazolyl group is selected from the group consisting of a 9-carbazolyl group, a 1-carbazolyl group, a 2-carbazolyl group, a 3-carbazolyl group, and a 4-carbazolyl group. Such a carbazolyl group is preferably a 9-carbazolyl group or a 3-carbazolyl group, and more preferably a 9-carbazolyl group. In the case where the diarylamino group or the carbazolyl group contains a substituent, there is no specific limitation on the type of the substituent. A preferable substituent may be any of the preferable substituents represented by each of $R^1$ through $R^8$ described above. In general formula (17), any of $R^1$ through $R^8$ may be a substituted or unsubstituted diarylamino group or a substituted or unsubstituted carbazolyl group. It is preferred that at least one of $R^3$ and $R^6$ is a substituted or unsubstituted diarylamino group or a substituted or unsubstituted carbazolyl group.

The compound represented by general formula (16) contains at least two carbazolyl structures in a molecule. General formula (16) shows one carbazolyl structure. Therefore, at least one of $R^1$ through $R^8$, $Z^1$ and $Z^2$ needs to be a group containing a carbazolyl structure. Preferably, at least one of $R^1$ through $R^4$, at least one of $R^5$ through $R^8$, or $Z^1$ is a group containing a carbazolyl structure. More preferably, at least one of $R^3$, $R^6$ and $Z^1$ is a group containing a carbazolyl structure. It is also preferred that two of $R^3$, $R^6$ and $Z^1$ are each a group containing a carbazolyl structure. It is also preferred that all of $R^3$, $R^6$ and $Z^1$ are each a group containing a carbazolyl structure.

The compound represented by general formula (16) preferably contains at least three carbazolyl structures in a molecule, and more preferably contains at least four carbazolyl structures in a molecule.

In chemical formulas (17) through (21), Ar independently represents an aromatic hydrocarbon group or an aromatic heterocyclic group. R is independently hydrogen or a monovalent substituent, and contains a structure in which substituents adjacent to each other integrally form a ring or a structure in which substituents adjacent to each other do not integrally form a ring.

In chemical formulas (17) through (21), Ar is preferably an aromatic hydrocarbon group having a ring-forming carbon number of 6 through 100 or an aromatic heterocyclic group having a ring-forming carbon number of 3 through 100, and is more preferably an aromatic hydrocarbon group having a ring-forming carbon number of 5 through 50 or an aromatic heterocyclic group having a ring-forming carbon number of 3 through 50. Still more preferably, Ar is an aromatic hydrocarbon group having a ring-forming carbon number of 6 through 50 or an aromatic heterocyclic group having a ring-forming carbon number of 3 through 50. In the case where such an aromatic hydrocarbon group or such an aromatic heterocyclic group contains at least one substituent, the number of the carbons contains the number of carbons as such substituents.

A preferable aromatic hydrocarbon group or aromatic heterocyclic group is selected from the group consisting of groups generated as a result of removal of one hydrogen atom from benzene, pentalene, indene, naphthalene, azulene, heptalene, octalene, indacene, acenaphthylene, phenalene, phenanthrene, anthracene, trindene, fluoranthene, acephenanthrylene, aceanthrylene, triphenylene, pyrene, chrysene, tetraphene, tetracene, pleiadene, picene, perylene, pentaphene, pentacene, tetraphenylene, cholanthrylene, helicene, hexaphene, rubicene, coronene, trinaphthylene, heptaphene, pyranthrene, ovalene, corannulene, fulminene, anthanthrene, zethrene, terrylene, naphthacenonaphthacene, truxene, furan, benzofuran, isobenzofuran, xanthene, oxathrene, dibenzofuran, perixanthenoxanthene, thiophene, thioxanthene, thianthrene, phenoxathiin, thionaphthene, isothianaphthene, thiophthene, thiophanthrene, dibenzothiophene, pyrrol, pyrazole, tellurazole, selenazole, thiazole, isothiazole, oxazole, furazan, pyridine, pyrazine, pyrimidine, pyridazine, triazine, indolizine, indole, isoindole, indazole, purine, quinolizine, isoquinoline, carbazole, indolocarbazole, imidazole, naphthyridine, phthalazine, quinazoline, benzodiazepine, quinoxaline, cinnoline, quinoline, pteridine, phenanthridine, acridine, perimidine, phenanthroline, phenazine, carboline, phenotellurazine, phenoselenazine, phenothiazine, phenoxazine, anthyridine, thebenidine, quindoline, quinindoline, acrindoline, phthaloperine, triphenodithiazine, triphenodioxazine, phenanthrazine, anthrazine, benzothiazole, benzimidazole, benzoxazole, benzoisoxazole, benzoisothiazole, and an aromatic compound containing a plurality of such aromatic rings that are coupled with each other. A more preferable aromatic hydrocarbon group or aromatic heterocyclic group is selected from the group consisting of groups generated as a result of removal of one hydrogen atom from benzene, naphthalene, pyridine, pyrazine, pyrimidine, pyridazine, triazine, isoindole, indazole, purine, isoquinoline, imidazole, naphthyridine, phthalazine, quinazoline, benzodiazepine, quinoxaline, cinnoline, quinoline, pteridine, phenanthridine, acridine, perimidine, phenanthroline, phenazine, carboline, indole, carbazole, indolocarbazole, and an aromatic compound containing a plurality of such aromatic rings that are coupled with each other. In the case where the above-described aromatic hydrocarbon group or the above-described aromatic heterocyclic group is a group generated from an aromatic compound containing a plurality of aromatic rings that are coupled with each other, the number of the coupled aromatic rings is preferably 2 through 10, and more preferably 2 through 7. The coupled aromatic rings may be of the same type or of different types. In this case, there is no specific limitation on the bonding position of Ar bonded with N. The bonding position of Ar may be in a terminal ring, or in a central ring, of the coupled aromatic rings. In the case where the aromatic ring represented by Ar is a group generated as a result of removal of one hydrogen atom from the aromatic compound containing a plurality of aromatic rings coupled with each other, in the case where the first aromatic ring bonded with N in each of chemical formulas (18) through (22) is an aromatic hydrocarbon ring, the aromatic ring is contained in the aromatic hydrocarbon group. In the case where the first aromatic ring bonded with N in each of chemical formulas (18) through (22) is an aromatic heterocyclic ring, the aromatic ring is contained in the aromatic heterocyclic group. Herein, the "aromatic ring" encompasses an aromatic hydrocarbon ring and an aromatic heterocyclic ring.

A group generated as a result of coupling of a plurality of the aromatic rings described above is selected from the group consisting of groups generated as a result of removal of one hydrogen atom from, for example, biphenyl, terphenyl, bipyridine, bipyrimidine, bitriazine, terpyridine, bistriazylbenzene, dicarbazolylbenzene, carbazolylbiphenyl, dicarbazolylbiphenyl, indolocarbazolyltriazine, phenylterphenyl, carbazolylterphenyl, binaphthalene, phenylpyridine, phenylcarbazole, diphenylcarbazole, diphenylpyridine, phenylpyrimidine, diphenylpyrimidine, phenyltriazine, diphenyltriazine, phenylnaphthalene, diphenylnaphthalene, indolocarbazolylbenzene, indolocarbazolylpyridine, indolocarbazolyltriazine, and the like.

The above-described aromatic hydrocarbon group or the aromatic heterocyclic group may contain a substituent. The number of the substituents is preferably 1 through 10, more preferably 1 through 6, and still more preferably 1 through 4. The group generated from an aromatic compound containing a plurality of aromatic rings that are coupled with each other may similarly contain a substituent. A preferable substituent is selected from the group consisting of an alkyl group having a carbon number of 1 through 20, an alkoxy group having a carbon number of 1 through 20, an alkylthio group having a carbon number of 1 through 20, an alkyl-substituted amino group having a carbon number of 1 through 20, an acyl group having a carbon number of 2 through 20, a diarylamino group having a ring-forming carbon number of 12 through 24, an alkenyl group having a carbon number of 2 through 10, an alkynyl group having a carbon number of 2 through 10, an alkoxycarbonyl group having a carbon number of 2 through 10, an alkylsulfonyl group having a carbon number of 1 through 10, a haloalkyl group having a carbon number of 1 through 10, an amide group, an alkylamide group having a carbon number of 2 through 10, a trialkylsilyl group having a carbon number of 3 through 20, a trialkylsilylalkyl group having a carbon number of 4 through 20, a trialkylsilylalkenyl group having a carbon number of 5 through 20, a trialkylsilylalkynyl group having a carbon number of 5 through 20, a cyano group, a nitro group, a hydroxy group, and the like. A more preferable substituent is selected from the group consisting of a methyl group, an ethyl group, an n-propyl group, an i-propyl group, an n-butyl group, a t-butyl group, a methoxy group, an ethoxy group, an n-propoxy group, an i-propoxy group, and a diphenylamino group. In the case where at least two substituents are contained, the substituents may be the same as, or different from, each other.

At least one of Ar's in each of chemical formulas (17) through (21) is preferably an aromatic heterocyclic group, and is more preferably a group represented by general formula (24).

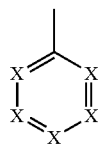

(24)

X independently represents N, C—H, or C—Ar$_1$, and at least one of X's is N. Ar$_1$ independently represents an aromatic hydrocarbon group or an aromatic heterocyclic group. The number of N's is preferably 1 through 3, more preferably 2 through 3, and still more preferably 3. In the case where X is C—Ar$_1$, Ar$_1$ and a ring containing X may form a condensed ring while sharing one side. A specific example of preferable Ar$_1$ is any of substantially the same as those of the aromatic hydrocarbon group or the aromatic heterocyclic group described above regarding Ar. A specific example of preferable substituent is any of substantially the same as those described above regarding Ar.

A specific example of the group represented by general formula (24) may be a group generated from pyridine, pyrazine, pyrimidine, pyridazine, or triazine. In the case where the group represented by general formula (24) forms a condensed group formed by Ar$_1$ and a ring containing X sharing one side, a specific example of the group represented by general formula (24) is selected from the group consisting of groups generated as a result of removal of one hydrogen atom from indolizine, purine, quinolizine, isoquinoline, naphthyridine, phthalazine, quinazoline, quinoxaline, cinnoline, quinoline, pteridine, phenanthridine, acridine, perimidine, phenanthroline, phenazine, carboline, anthyridine, thebenidine, quindoline, quinindoline, acrindoline, and phthaloperine. Preferably, a specific example of the group represented by general formula (24) is selected from the group consisting of groups generated as a result of removal of one hydrogen atom from pyridine, pyrazine, pyrimidine, pyridazine, triazine, purine, quinolizine, naphthyridine, phthalazine, quinazoline, quinoxaline, cinnoline, pteridine, and anthyridine.

In each of chemical formulas (17) through (21), R independently represents hydrogen or a monovalent substituent. R is selected from the group consisting of hydrogen, an alkyl group having a carbon number of 1 through 20, an aralkyl group having a carbon number of 7 through 20, an alkenyl group having a carbon number of 2 through 20, an alkynyl group having a carbon number of 2 through 20, a cyano group, a dialkylamino group having a carbon number of 2 through 20, a diarylamino group having a ring-forming carbon number of 12 through 20, a diaralkylamino group having a carbon number of 12 through 20, an amino group, a nitro group, an acyl group having a carbon number of 2 through 20, an alkoxycarbonyl group having a carbon number of 2 through 20, an alkoxy group having a carbon number of 1 through 20, an alkylsulfonyl group having a carbon number of 1 through 20, a hydroxy group, an amide group, a substituted or unsubstituted aromatic hydrocarbon group having a ring-forming carbon number of 6 through 30, a substituted or unsubstituted aromatic heterocyclic group having a ring-forming carbon number of 3 through 30, a haloalkyl group having a carbon number of 1 through 10, an alkylamide group having a carbon number of 2 through 10, a trialkylsilyl group having a carbon number of 3 through 20, a trialkylsilylalkyl group having a carbon number of 4 through 20, a trialkylsilylalkenyl group having a carbon number of 5 through 20, and a trialkylsilylalkynyl group having a carbon number of 5 through 20, an alkylthio group having a carbon number of 1 through 10, an alkylamino group having a carbon number of 1 through 10. Preferably, R is selected from the group consisting of hydrogen, an alkyl group having a carbon number of 1 through 10, an alkoxy group having a carbon number of 1 through 10, an alkylthio group having a carbon number of 1 through 10, an alkylamino group having a carbon number of 1 through 10, an acyl group having a carbon number of 2 through 10, an aralkyl group having a carbon number of 7 through 20, a substituted or unsubstituted aromatic hydrocarbon group having a ring-forming carbon number of 6 through 30, a substituted or unsubstituted aromatic 6-member heterocyclic group having a ring-forming carbon number of 3 through 30, and the like. More preferably, R is selected from the group consisting of hydrogen, an alkyl group having a carbon number of 1 through 3, an alkoxy group having a carbon number of 1 through 3, an acyl group having a carbon number of 2 through 4, a phenyl group, and a pyridyl group.

In chemical formula (22), X represents an oxygen atom or a sulfur atom. $R^1$ through $R^9$ are each a hydrogen atom, a deuterium atom, a fluorine atom, a chlorine atom, a cyano group, a nitro group, an alkyl group having a carbon number of 1 through 6, a cycloalkyl group having a carbon number of 5 through 10, an alkenyl group having a carbon number of 2 through 6, an alkyloxy group having a carbon number of 1 through 6, a cycloalkyloxy group having a carbon number of 5 through 10, an aromatic hydrocarbon group, an aromatic heterocyclic group, a condensed polycyclic aromatic group, or an aryloxy group. $R^1$ through $R^9$ are bonded to each other by a single bond or via a methylene group, an oxygen atom or a sulfur atom to form a ring or not to form a ring. $R^{10}$ and $R^{11}$ are each selected from a group consisting of an alkyl group having a carbon number of 1 through 6, a cycloalkyl group having a carbon number of 5 through 10, an alkenyl group having a carbon number of 2 through 6, an alkyloxy group having a carbon number of 1 through 6, a cycloalkyloxy group having a carbon number of 5 through 10, an aromatic hydrocarbon group, an aromatic heterocyclic group, a condensed polycyclic aromatic group, and an aryloxy group. $R^{10}$ and $R^{11}$ are bonded to each other by a single bond or via a methylene group, an oxygen atom or a sulfur atom to form a ring or not to form a ring. $Ar^1$, $Ar^2$ and $Ar^3$ each represent an aromatic hydrocarbon group, an aromatic heterocyclic group or a condensed polycyclic aromatic group. $Ar^2$ and $Ar^3$ are bonded to each other by a single bond or via a methylene group, an oxygen atom or a sulfur atom to form a ring or not to form a ring. A represents a divalent radical of aromatic hydrocarbon group, aromatic heterocyclic group, and condensed polycyclic aromatic group or single-bond. In the case where A is a divalent aromatic hydrocarbon group, a divalent aromatic heterocyclic group, or a divalent condensed polycyclic aromatic group, A and $Ar^2$ are bonded to each other by a single bond or via a methylene group, an oxygen atom or a sulfur atom to form a ring or not to form a ring.

A preferable compound among the compounds according to the present invention represented by general formula (22) is a compound in which $R^1$, $R^2$, $R^3$ and A are bonded at positions represented by general formula (25) below in a benzene ring to which A is bonded.

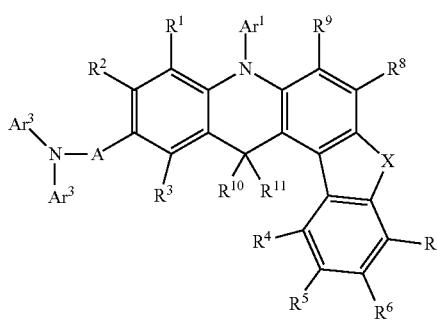

(25)

X represents an oxygen atom or a sulfur atom. In the case where X is a sulfur atom, the compound according to the present invention has a benzothienoacridan ring structure. In the case where X is an oxygen atom, the compound according to the present invention has a benzofuroacridan ring structure.

$R^1$ through $R^9$ may be the same as, or different from, each other. $R^1$ through $R^9$ are each selected from the group consisting of a hydrogen atom, a deuterium atom, a fluorine atom, a chlorine atom, a cyano group, a nitro group, an alkyl group having a carbon number of 1 through 6, a cycloalkyl group having a carbon number of 5 through 10, an alkenyl group having a carbon number of 2 through 6, an alkyloxy group having a carbon number of 1 through 6, a cycloalkyloxy group having a carbon number of 5 through 10, an aromatic hydrocarbon group, an aromatic heterocyclic group, a condensed polycyclic aromatic group, and an aryloxy group. These groups may be bonded to each other by a single bond or via a methylene group that may contain a substituent, an oxygen atom or a sulfur atom to form a ring.

The alkyl group having a carbon number of 1 through 6, the cycloalkyl group having a ring-forming carbon number of 5 through 10, or the alkenyl group having a carbon number of 2 through 6 represented by each of $R^1$ through $R^9$ is selected from the group consisting of a methyl group, an ethyl group, an n-propyl group, an isopropyl group, an n-butyl group, an isobutyl group, a tert-butyl group, an n-pentyl group, an isopentyl group, a neopentyl group, an n-hexyl group, a cyclopentyl group, a cyclohexyl group, a 1-adamantyl group, a 2-adamantyl group, a vinyl group, an allyl group, an isopropenyl group, a 2-butenyl group, and the like. The alkyl group having a carbon number of 2 through 6 or the alkenyl group having a carbon number of 2 through 6 represented by each of $R^1$ through $R^9$ may be straight-chained or branched.

The alkyl group having a carbon number of 1 through 6, the cycloalkyl group having a ring-forming carbon number of 5 through 10, or the alkenyl group having a carbon number of 2 through 6 represented by each of $R^1$ through $R^9$ may contain a substituent. The substituent is selected from the group consisting of a deuterium atom, a cyano group, a nitro group, a halogen atom (for example, a fluorine atom, a chlorine atom, a bromine, or an iodine atom), a straight or branched alkyloxy group having a carbon number of 1 through 6 (for example, a methyloxy group, an ethyloxy group, or a propyloxy group), an alkenyl group (for example, an allyl group), an aryloxy group (for example, a phenyloxy group or a tolyloxy group), an arylalkyloxy group (for example, a benzyloxy group or a phenethyloxy group), an aromatic hydrocarbon group or a condensed polycyclic aromatic group (for example, a phenyl group, a biphenylyl group, a terphenylyl group, a naphthyl group, an anthracenyl group, a phenanthryl group, a fluorenyl group, an indenyl group, a pyrenyl group, a perylenyl group, a fluoranthenyl group, or a triphenylenyl group), and an aromatic heterocyclic group (for example, a pyridyl group, a thienyl group, a furyl group, a pyrollyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzimidazolyl group, a pyrazolyl group, a dibenzofuranyl group, a dibenzothienyl group, or a carbolinyl group). Such a substituent may further contain a substituent. The substituent further contained may be any of the above-described substituents. The substituents may be bonded to each other by a single bond or via a methylene group that may contain a substituent, an oxygen atom or a sulfur atom to form a ring.

The alkyloxy group having a carbon number of 1 through 6 or the cycloalkyloxy group having a carbon number of 5 through 10 represented by each of $R^1$ through $R^9$ is selected from the group consisting of a methyloxy group, an ethyloxy group, an n-propyloxy group, an isopropyloxy group, an n-butyloxy group, a tert-butyloxy group, an n-pentyloxy group, an n-hexyloxy group, a cyclopentyloxy group, a cyclohexyloxy group, a cycloheptyloxy group, a cyclooctyloxy group, a 1-adamantyloxy group, a 2-adamantyloxy group, and the like. The alkyloxy group having a carbon number of 1 through 6 represented by each of $R^1$ through $R^9$ may be straight-chained or branched.

The alkyloxy group having a carbon number of 1 through 6 or the cycloalkyloxy group having a carbon number of 5 through 10 represented by each of $R^1$ through $R^9$ may contain a substituent. The substituent may be any of the same substituents as those that may be contained in the alkyl group having a carbon number of 1 through 6, the cycloalkyl group having a ring-forming carbon number of 5 through 10 or the alkenyl group having a carbon number of 2 through 6 represented by each of $R^1$ through $R^9$. Such a substituent may further contain a substituent. The substituent further contained may also be any of the same substituents as those that may be contained in the alkyl group having a carbon number of 1 through 6, the cycloalkyl group having a ring-forming carbon number of 5 through 10 or the alkenyl group having a carbon number of 2 through 6 represented by each of $R^1$ through $R^9$. The above-described substituents may be bonded to each other by a single bond or via a methylene group that may contain a substituent, an oxygen atom or a sulfur atom to form a ring.

The aromatic hydrocarbon group, the aromatic heterocyclic group, or the condensed polycyclic aromatic group represented by each of $R^1$ through $R^9$ is selected from the group consisting of a phenyl group, a biphenylyl group, a terphenylyl group, a naphthyl group, an anthryl group, a phenanthryl group, a fluorenyl group, an indenyl group, a pyrenyl group, a perylenyl group, a fluoranthenyl group, a triphenylenyl group, a pyridyl group, a furyl group, a pyrollyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzimidazolyl group, a pyrazolyl group, a dibenzofuranyl group, a dibenzothienyl group, a carbolinyl group, and the like. The aromatic heterocyclic group represented by each of $R^1$ through $R^9$ is preferably a sulfur-containing aromatic heterocyclic group such as a thienyl group, a benzothienyl group, a benzothiazolyl group, a dibenzothienyl group, or the like.

The aromatic hydrocarbon group, the aromatic heterocyclic group, or the condensed polycyclic aromatic group represented by each of $R^1$ through $R^9$ may contain a substituent. The substituent is selected from the group consisting of a deuterium atom, a trifluoromethyl group, a cyano group, a nitro group, a halogen atom (for example, a fluorine atom, a chlorine atom, a bromine atom, or an iodine atom), a straight or branched alkyl group having a carbon number of 1 through 6 (for example, a methyl group, an ethyl group, an n-propyl group, an isopropyl group, an n-butyl group, an isobutyl group, a tert-butyl group, an n-pentyl group, an isopentyl group, a neopentyl group, or an n-hexyl group), a straight or branched alkyloxy group having a carbon number of 1 through 6 (for example, a methyloxy group, an ethyloxy group, or a propyloxy group), an alkenyl group (for example, an allyl group), an aralkyl group (for example, a benzyl group, a naphthylmethyl group, or a phenethyl group), an aryloxy group (for example, a phenyloxy group or a tolyloxy group), an arylalkyloxy group (for example, a benzyloxy group or a phenethyloxy group), an aromatic hydrocarbon group or a condensed polycyclic aromatic group (for example, a phenyl group, a biphenylyl group, a terphenylyl group, a naphthyl group, an anthracenyl group, a phenanthryl group, a fluorenyl group, an indenyl group, a pyrenyl group, a perylenyl group, a fluoranthenyl group, or a triphenylenyl group), an aromatic heterocyclic group (for example, a pyridyl group, a thienyl group, a furyl group, a pyrollyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzimidazolyl group, a pyrazolyl group, a dibenzofuranyl group, a dibenzothienyl group, or a carbolinyl group), an arylvinyl group (for example, a styryl group or a naphthylvinyl group), an acyl group (for example, an acetyl group or a benzoyl group), a dialkylamino group (for example, a dimethylamino group or a diethylamino group), a disubstituted amino group substituted with an aromatic hydrocarbon group or a condensed polycyclic aromatic group (for example, a diphenylamino group or a dinaphthylamino group), a diaralkylamino group (for example, a dibenzylamino group or a diphenethylamino group), a disubstituted amino group substituted with an aromatic heterocyclic group (for example, a dipyridylamino group or a dithienylamino group), a dialkenylamino group (for example, a diallylamino group), a disubstituted amino group substituted with a substituent selected from the group consisting of an alkyl group, an aromatic hydrocarbon group, a condensed polycyclic aromatic group, an aralkyl group, an aromatic heterocyclic group and an alkenyl group, and the like. Such a substituent may further contain a substituent. The substituent further contained may be any of the same substituents as those that may be contained in the aromatic hydrocarbon group or the like represented by each of $R^1$ through $R^9$. The substituents may be bonded to each other by a single bond or via a methylene group that may contain a substituent, an oxygen atom or a sulfur atom to form a ring.

The aryloxy group represented by each of $R^1$ through $R^9$ is selected from the group consisting of phenyloxy group, biphenylyloxy group, terphenylyloxy group, naphthyloxy group, anthryloxy group, phenanthryloxy group, fluorenyloxy group, indenyloxy group, pyrenyloxy group, perylenyloxy group, and the like.

The aryloxy group represented by each of $R^1$ through $R^9$ may contain a substituent. The substituent may be any of the same substituents as those that may be contained in the aromatic hydrocarbon group, the aromatic heterocyclic group, or the condensed polycyclic aromatic group represented by each of $R^1$ through $R^9$. Such a substituent may further contain a substituent. The substituent further contained may also be any of the same substituents as those that may be contained in the aromatic hydrocarbon group, the aromatic heterocyclic group, or the condensed polycyclic aromatic group represented by each of $R^1$ through $R^9$. The substituents may be bonded to each other by a single bond or via a methylene group that may contain a substituent, an oxygen atom or a sulfur atom to form a ring.

$R^{10}$ and $R^{11}$ may be the same as, or different from, each other. $R^{10}$ and $R^{11}$ are each selected from the group consisting of an alkyl group having a carbon number of 1 through 6, a cycloalkyl group having a ring-forming carbon number of 5 through 10, an alkenyl group having a carbon number of 2 through 6, an alkyloxy group having a carbon number of 1 through 6, a cycloalkyloxy group having a ring-forming carbon number of 5 through 10, an aromatic hydrocarbon group, an aromatic heterocyclic group, a condensed polycyclic aromatic group, and an aryloxy group. Such groups may be bonded to each other by a single bond or via a methylene group that may contain a substituent, an oxygen atom or a sulfur atom to form a ring.

The alkyl group having a carbon number of 1 through 6, the cycloalkyl group having a ring-forming carbon number of 5 through 10, or the alkenyl group having a carbon number of 2 through 6 represented by each of $R^{10}$ and $R^{11}$ may be any of the same groups as those listed above as examples of the alkyl group having a carbon number of 1 through 6, the cycloalkyl group having a ring-forming carbon number of 5 through 10, or the alkenyl group having a carbon number of 2 through 6 represented by each of $R^1$ through $R^9$. As understood from the groups described above as examples, the alkyl group having a carbon number of 1 through 6 or the alkenyl group having a carbon number of 2 through 6 represented by each of $R^{10}$ and $R^{11}$ may be straight-chained or branched.

The alkyl group having a carbon number of 1 through 6, the cycloalkyl group having a ring-forming carbon number of 5 through 10, or the alkenyl group having a carbon number of 2 through 6 represented by each of $R^{10}$ and $R^{11}$ may contain a substituent. The substituent may be any of the same substituents as those that may be contained in the alkyl group having a carbon number of 1 through 6, the cycloalkyl group having a ring-forming carbon number of 5 through 10, or the alkenyl group having a carbon number of 2 through 6 represented by each of $R^1$ through $R^9$. Such a substituent may further contain a substituent. The substituent further contained may also be any of the same substituents as those that may be contained in the alkyl group having a carbon number of 1 through 6, the cycloalkyl group having a ring-forming carbon number of 5 through 10, or the alkenyl group having a carbon number of 2 through 6 represented by each of $R^1$ through $R^9$. The substituents may be bonded to each other by a single bond or via a methylene group that may contain a substituent, an oxygen atom or a sulfur atom to form a ring.

The alkyloxy group having a carbon number of 1 through 6 or the cycloalkyloxy group having a ring-forming carbon number of 5 through 10 represented by each of $R^{10}$ and $R^{11}$ may be any of the same groups as those listed above as examples of the alkyloxy group having a carbon number of 1 through 6 or the cycloalkyloxy group having a ring-forming carbon number of 5 through 10 represented by each of $R^1$ through $R^9$. The alkyloxy group having a carbon number of 1 through 6 may be straight-chained or branched.

The alkyloxy group having a carbon number of 1 through 6 or the cycloalkyloxy group having a ring-forming carbon number of 5 through 10 represented by each of $R^{10}$ and $R^{11}$ may contain a substituent. The substituent may be any of the same substituents as those that may be contained in the alkyl group having a carbon number of 1 through 6, the cycloalkyl group having a ring-forming carbon number of 5 through 10, or the alkenyloxy group having a carbon number of 2 through 6 represented by each of $R^1$ through $R^9$. Such a group may further contain a substituent. The substituent further contained may also be any of the same substituents as those that may be contained in the alkyl group having a carbon number of 1 through 6, the cycloalkyl group having a ring-forming carbon number of 5 through 10, or the alkenyl group having a carbon number of 2 through 6 represented by each of $R^1$ through $R^9$. The substituents may be bonded to each other by a single bond or via a methylene group that may contain a substituent, an oxygen atom or a sulfur atom to form a ring.

The aromatic hydrocarbon group, the aromatic heterocyclic group, or the condensed polycyclic aromatic group represented by each of $R^{10}$ and $R^{11}$ may be any of the same groups as those listed above as examples of the aromatic hydrocarbon group, the aromatic heterocyclic group, or the condensed polycyclic aromatic group represented by each of $R^1$ through $R^9$. The aromatic heterocyclic group represented by each of $R^{10}$ and $R^{11}$ is preferably a sulfur-containing aromatic heterocyclic group such as a thienyl group, a benzothienyl group, a benzothiazolyl group, a dibenzothienyl group, or the like.

The aromatic hydrocarbon group, the aromatic heterocyclic group, or the condensed polycyclic aromatic group represented by each of $R^{10}$ and $R^{11}$ may contain a substituent. The substituent may be any of the same substituents as those that may be contained in the aromatic hydrocarbon group, the aromatic heterocyclic group, or the condensed polycyclic aromatic group represented by each of $R^1$ through $R^9$. Such a substituent may further contain a substituent. The substituent further contained may also be any of the same substituents as those that may be contained in the aromatic hydrocarbon group, the aromatic heterocyclic group, or the condensed polycyclic aromatic group represented by each of $R^1$ through $R^9$. The substituents may be bonded to each other by a single bond or via a methylene group that may contain a substituent, an oxygen atom or a sulfur atom to form a ring.

The aryloxy group represented by each of $R^{10}$ and $R^{11}$ may be any of the same groups as those listed above as examples of the aryloxy group represented by each of $R^1$ through $R^9$.

The aryloxy group represented by each of $R^{10}$ and $R^{11}$ may contain a substituent. The substituent may be any of the same substituents as those that may be contained in the aromatic hydrocarbon group, the aromatic heterocyclic group, or the condensed polycyclic aromatic group represented by each of $R^1$ through $R^9$. Such a substituent may further contain a substituent. The substituent further contained may also be any of the same substituents as those that may be contained in the aromatic hydrocarbon group, the aromatic heterocyclic group, or the condensed polycyclic aromatic group represented by each of $R^1$ through $R^9$. The substituents may be bonded to each other by a single bond or via a methylene group that may contain a substituent, an oxygen atom or a sulfur atom to form a ring.

$Ar^1$, $Ar^2$ and $Ar^3$ may be the same as, or different from, each other. $Ar^1$, $Ar^2$ and $Ar^3$ each represent an aromatic hydrocarbon group, an aromatic heterocyclic group, or a condensed polycyclic aromatic group. The groups represented by $Ar^1$, $Ar^2$ and $Ar^3$ may be bonded to each other by a single bond or via a methylene group that may contain a substituent, an oxygen atom or a sulfur atom to form a ring. For example, $Ar^2$ and $Ar^3$ may be bonded to each other by a single bond or via a methylene group that may contain a substituent, an oxygen atom or a sulfur atom to form a ring.

The aromatic hydrocarbon group, the aromatic heterocyclic group, or the condensed polycyclic aromatic group represented by each of $Ar^1$, $Ar^2$ and $Ar^3$ may be any of the same groups as those listed above as examples of as the aromatic hydrocarbon group, the aromatic heterocyclic group, or the condensed polycyclic aromatic group represented by each of $R^1$ through $R^9$. The aromatic heterocyclic group represented by each of $Ar^1$, $Ar^2$ and $Ar^3$ is preferably a sulfur-containing aromatic heterocyclic group such as a thienyl group, a benzothienyl group, a benzothiazolyl group, a dibenzothienyl group, or the like, or an oxygen-containing aromatic heterocyclic group such as a furyl group, a benzofuranyl group, a benzoxazolyl group, a dibenzofuranyl group, or the like.

The aromatic hydrocarbon group, the aromatic heterocyclic group, or the condensed polycyclic aromatic group represented by each of $Ar^1$, $Ar^2$ and $Ar^3$ may contain a substituent. The substituent is selected from the group consisting of a deuterium atom, a cyano group, a nitro group, a halogen atom (for example, a fluorine atom, a chlorine atom, a bromine atom or an iodine atom), a straight or branched alkyl group having a carbon number of 1 through 6 (for example, a methyl group, an ethyl group, an n-propyl group, an isopropyl group, an n-butyl group, an isobutyl group, a tert-butyl group, an n-pentyl group, an isopentyl group, a neopentyl group, or an n-hexyl group), a straight or branched alkyloxy group having a carbon number of 1 through 6 (for example, a methyloxy group, an ethyloxy group, or a propyloxy group), an alkenyl group (for example, an allyl group), an aryloxy group (for example, a phenyloxy group or a tolyloxy group), an arylalkyloxy group (for example, a benzyloxy group or a phenethyloxy group), an aromatic hydrocarbon group or a condensed polycyclic aromatic group (for example, a phenyl group, a biphenylyl group, a terphenylyl group, a naphthyl group, an anthracenyl group, a phenanthryl group, a fluorenyl group, an indenyl group, a pyrenyl group, a perylenyl group, a fluoranthenyl group, a triphenylenyl group, or the like), an aromatic heterocyclic group (for example, a pyridyl group, a thienyl group, a furyl group, a pyrollyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzimidazolyl group, a pyrazolyl group, a dibenzofuranyl group, a dibenzothienyl group, a carbolinyl group, or the like), an arylvinyl group (for example, a styryl group, a naphthylvinyl group, or the like), an acyl group (for example, an acetyl group or a benzoyl group), and the like. Such a substituent may further contain a substituent. The substituent further contained may also be any of the same substituents as those that may be contained in the aromatic hydrocarbon group or the like represented by each of $Ar^1$, $Ar^2$ and $Ar^3$. The substituents, or the substituents and $Ar^1$, $Ar^2$ and $Ar^3$, may be bonded to each other by a single bond or via a methylene group that may contain a substituent, an oxygen atom or a sulfur atom to form a ring.

$Ar^1$ is preferably an aromatic hydrocarbon group, a sulfur-containing aromatic heterocyclic group, or a condensed polycyclic aromatic group, especially preferably a phenyl group, a biphenylyl group, a naphthyl group, a phenanthryl group, a fluorenyl group, a thienyl group, a benzothienyl group, or a dibenzothienyl, and most preferably a phenyl group, a biphenylyl group, a fluorenyl group, a benzothienyl group, or a dibenzothienyl group. $Ar^2$ and $Ar^3$ are each preferably an aromatic hydrocarbon group, an oxygen-containing aromatic heterocyclic group, a sulfur-containing aromatic heterocyclic group, or a condensed polycyclic aromatic group, especially preferably a phenyl group, a biphenylyl group, a terphenylyl group, a naphthyl group, an anthryl group, a phenanthryl group, a fluorenyl group, a triphenylenyl group, a furyl group, a thienyl group, a benzofuranyl group, a benzothienyl group, a dibenzofuranyl group, or a dibenzothienyl group, and most preferably a phenyl group, a biphenylyl group, a naphthyl group, a phenanthryl group, a fluorenyl group, a triphenylenyl group, a furyl group, a thienyl group, a benzofuranyl group, a benzothienyl group, a dibenzofuranyl group, or a dibenzothienyl group.

A is selected from the group consisting of a divalent aromatic hydrocarbon group, divalent aromatic heterocyclic group, and divalent condensed polycyclic aromatic group or single-bond. Such an aromatic hydrocarbon group, such an aromatic heterocyclic group, or such a condensed polycyclic aromatic group is selected from the group consisting of benzene, biphenyl, terphenyl, tetrakisphenyl, styrene, naphthalene, anthracene, acenaphthalene, fluorene, phenanthrene, indane, pyrene, pyridine, pyrimidine, triazine, furan, pyrol, thiophene, quinoline, isoquinoline, benzofuran, benzothiophene, indoline, carbazole, carboline, benzoxazole, benzothiazole, quinoxaline, benzimidazole, pyrazole, dibenzofuran, dibenzothiophene, naphthyridine, phenanthroline, acridan, and the like. The divalent group represented by A is generated as a result of removal of two hydrogen atoms from the aromatic hydrocarbon group, the aromatic heterocyclic group, or the condensed polycyclic aromatic described above. The aromatic heterocyclic group is preferably a sulfur-containing aromatic heterocyclic group such as thiophene, benzothiophene, benzothiazole, dibenzothiophene, or the like, or an oxygen-containing aromatic heterocyclic group such as furan, benzofuran, benzoxazole, dibenzofuran, or the like.

The aromatic hydrocarbon group, the aromatic heterocyclic group, or the condensed polycyclic aromatic may contain a substituent. The substituent may be any of the same substituents as those that may be contained in the aromatic hydrocarbon group, the aromatic heterocyclic group, or the condensed polycyclic aromatic group represented by each of $Ar^1$, $Ar^2$ and $Ar^3$. Such a substituent may further contain a substituent. The substituent further contained may also be any of the same substituents as those that may be contained in the aromatic hydrocarbon group, the aromatic heterocyclic group, or the condensed polycyclic aromatic group represented by each of $Ar^1$, $Ar^2$ and $Ar^3$. The substituents may be bonded to each other by a single bond or via a methylene group that may contain a substituent, an oxygen atom or a sulfur atom to form a ring.

A is preferably a divalent aromatic hydrocarbon group or a divalent condensed polycyclic aromatic group or single-bond, and especially preferably a divalent group derived from benzene or a single-bond.

In chemical formula (23), A represents a single-bond or divalent aromatic hydrocarbon group, a divalent aromatic heterocyclic group, or a divalent condensed polycyclic aromatic group. $Ar^1$ represents an unsubstituted phenyl group, and Are represents an aromatic hydrocarbon group, an aromatic heterocyclic group or a condensed polycyclic aromatic group. $R^1$ through $R^9$ are the same as, or different from, each other. $R^1$ through $R^9$ each represent a hydrogen atom, a deuterium atom, a fluorine atom, a chlorine atom, a cyano group, a trifluoromethyl group, an alkyl group having a carbon number of 1 through 6, an aromatic hydrocarbon group, an aromatic heterocyclic group, or a condensed polycyclic aromatic group. W, X, Y and Z each represent a carbon atom or a nitrogen atom. Only either one of W, X, Y and Z represents a nitrogen atom. The nitrogen atom does not contain the hydrogen atom represented by $R^1$ through $R^9$ or a substituent.

In chemical formula (23), A represents a single-bond or divalent aromatic hydrocarbon group, a divalent aromatic heterocyclic group, or a divalent condensed polycyclic aromatic group. The aromatic hydrocarbon group, the aromatic heterocyclic group, or the condensed polycyclic aromatic group is selected from the group consisting of benzene, biphenyl, terphenyl, tetrakisphenyl, styrene, naphthalene, anthracene, acenaphthylene, fluorene, phenanthrene, indane, pyrene, triphenylene, fluoranthene, benzofluoranthene, chrysene, pyridine, pyrimidine, triazine, furan, pyrol, thiophene, quinoline, isoquinoline, benzofuran, benzothiophene, indoline, carbazole, carboline, benzoxazole, benzothiazole, quinoxaline, benzimidazole, pyrazole, dibenzofuran, dibenzothiophene, naphthyridine, phenanthroline, acridine, bipyridine, phenylpyridine, and the like.

The divalent aromatic hydrocarbon group, the divalent aromatic heterocyclic group or the divalent condensed polycyclic aromatic group represented by A is generated as a result of removal of two hydrogen atoms from the aromatic hydrocarbon group, the aromatic heterocyclic group, or the condensed polycyclic aromatic described above. The aromatic hydrocarbon group does not have a condensed polycyclic structure. The aromatic heterocyclic group may have a condensed polycyclic structure.

The divalent hydrocarbon group, the divalent aromatic heterocyclic group, or the divalent condensed polycyclic aromatic represented by A may contain a substituent. The substituent is selected from the group consisting of a deuterium atom, a cyano group, a nitro group, a halogen atom (for example, a fluorine atom, or a chlorine atom), an alkyl group having a carbon number of 1 through 6 (for example, a methyl group, an ethyl group, an n-propyl group, an isopropyl group, an n-butyl group, an isobutyl group, a tert-butyl group, an n-pentyl group, an isopentyl group, a neopentyl group, or an n-hexyl group), an alkyloxy group having a carbon number of 1 through 6 (for example, a methyloxy group, an ethyloxy group, or a propyloxy group), an alkenyl group (for example, an allyl group), an aryloxy group (for example, a phenyloxy group or a tolyloxy group), an arylalkyloxy group (for example, a benzyloxy group or a phenethyloxy group), an aromatic hydrocarbon group or a condensed polycyclic aromatic group (for example, a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, a triphenylenyl group, a tetrakisphenyl group, a styryl group, an acenaphthenyl group, or a phenylnaphthyl group), an aromatic heterocyclic group (for example, a pyridyl group, a thienyl group, a furyl group, a pyrollyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a carbolinyl group, a triazinyl group, a pyrimidinyl group, a naphthyridinyl group, a phenanthrolinyl group, or an acridinyl group), an arylvinyl group (for example, a styryl group or a naphthylvinyl group), an acyl group (for example, an acetyl group or a benzoyl group), and the like. Among the above-described substituents, an alkyl group having a carbon number of 1 through 6 and an alkyloxy group having a carbon number of 1 through 6 may be straight-chained or branched. The above-described substituents may each be further substituted with any of the substituents listed above. The substituents may be bonded to each other by a single bond or via a substituted or unsubstituted methylene group, an oxygen atom or a sulfur atom to form a ring.

In chemical formula (23), $Ar^1$ and $Ar^2$ may be the same as, or different from, each other. $Ar^1$ and $Ar^2$ each represent an aromatic hydrocarbon group, an aromatic heterocyclic group, or a condensed polycyclic aromatic group. The aromatic hydrocarbon group, the aromatic heterocyclic group, or the condensed polycyclic aromatic group represented by each of $Ar^1$ and $Ar^2$ is selected from the group consisting of a phenyl group, a biphenylyl group, a terphenylyl group, a tetrakisphenyl group, a styryl group, a naphthyl group, an anthracenyl group, an acenaphthenyl group, a phenanthrenyl group, a triphenylenyl group, a fluorenyl group, an indenyl group, a pyrenyl group, a triazinyl group, a pyridyl group, a pyrimidinyl group, a furyl group, a pyrollyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, a chrysenyl group, a fluoranthenyl group, a benzofluoranthenyl group, and the like.

The aromatic hydrocarbon group, the aromatic heterocyclic group, or the condensed polycyclic aromatic group represented by each of $Ar^1$ and $Ar^2$ may contain a substituent. The substituent may be any of the same substituents as those that may be contained in the divalent aromatic hydrocarbon group, the divalent aromatic heterocyclic group, or the divalent condensed polycyclic aromatic group represented by A described above. The form in which the substituent may take is substantially the same as described above.

In general formula (23), $R^1$ through $R^9$ may be the same as, or different from, each other. $R^1$ through $R^9$ each represent a hydrogen atom, a deuterium atom, a fluorine atom, a chlorine atom, a cyano group, a trifluoromethyl group, an alkyl group having a carbon number of 1 through 6, an aromatic hydrocarbon group, an aromatic heterocyclic group, or a condensed polycyclic aromatic group. The alkyl group having a carbon number of 1 through 6 represented by each of $R^1$ through $R^9$ is selected from the group consisting of a methyl group, an ethyl group, an n-propyl group, an iso-propyl group, an n-butyl group, a 2-methylpropyl group, a tert-butyl group, an n-pentyl group, a 3-methylbutyl group, a tert-pentyl group, an n-hexyl group, an iso-hexyl group, a tert-hexyl group, and the like. The alkyl group having a carbon number of 1 through 6 may be straight-chained or branched.

The aromatic hydrocarbon group, the aromatic heterocyclic group, or the condensed polycyclic aromatic group represented by each of $R^1$ through $R^9$ may be any of the same groups as those listed above as examples of the aromatic hydrocarbon group, the aromatic heterocyclic group, or the condensed polycyclic aromatic group represented by each of $Ar^1$ and $Ar^2$.

The aromatic hydrocarbon group, the aromatic heterocyclic group, or the condensed polycyclic aromatic group represented by each of $R^1$ through $R^9$ may contain a substituent. The substituent may be any of the same substituents as those that may be contained in the divalent aromatic hydrocarbon group, the divalent aromatic heterocyclic group, or the divalent condensed polycyclic aromatic group represented by A. The form in which the substituent may take is substantially the same as described above.

In chemical formula (23), W, X, Y and Z each represent a carbon atom or a nitrogen atom. Only either one of W, X, Y and Z is a nitrogen atom (the remaining three are carbon atoms). In the case where either one of W, X, Y and Z is a nitrogen atom, the nitrogen atom does not contain a hydrogen atom represented by $R^1$ through $R^9$ or a substituent. More specifically, in the case where W is a nitrogen atom, $R^1$ is not present. In the case where X is a nitrogen atom, $R^2$ is not present. In the case where Y is a nitrogen atom, $R^3$ is not present. In the case where Z is a nitrogen atom, $R^4$ is not present.

In a benzopyridoindole derivative according to the present invention represented by chemical formula (23), A is preferably a divalent aromatic hydrocarbon group including one or two rings, a divalent aromatic heterocyclic group including one or two rings, or a divalent naphthalene or single-bond. The aromatic hydrocarbon group including one or two rings, or the aromatic heterocyclic group including one or two rings, may be benzene, biphenyl, styrene, indane, pyridine, pyrimidine, triazine, furan, pyrol, thiophene, quinoline, isoquinoline, benzofuran, benzothiophene, indoline, benzoxazole, benzothiazole, quinoxaline, benzimidazole, pyrazole, naphthyridine, bipyridine, phenylpyridine, or the like. A is more preferably a divalent aromatic hydrocarbon group including one or two rings or a divalent naphthalene or single-bond, still more preferably a divalent group generated as a result of removal of two hydrogen atoms from benzene, biphenyl or naphthalene, or a single-bond group, and especially preferably a divalent group generated as a result of removal of two hydrogen atoms from benzene or biphenyl, or a single-bond group.

$Ar^1$ is preferably an aromatic hydrocarbon group, a condensed polycyclic aromatic group, a sulfur-containing aromatic heterocyclic group such as a dibenzothienyl group or the like, or an oxygen-containing aromatic heterocyclic group such as a dibenzofuranyl group or the like. $Ar^1$ is more preferably a phenyl group, and especially preferably an unsubstituted phenyl group, from the point of view of the bipolar property of the compound.

$Ar^2$ is preferably an aromatic hydrocarbon group including at least three rings, an aromatic heterocyclic group including at least three rings, or a condensed polycyclic aromatic group including at least three rings. The aromatic hydrocarbon group including at least three rings, the aromatic heterocyclic group including at least three rings, or the condensed polycyclic aromatic group including at least three rings is selected from the group consisting of a terphenylyl group, a tetrakisphenyl group, an anthracenyl group, an acenaphthenyl group, a phenanthrenyl group, a triphenylenyl group, a fluorenyl group, a pyrenyl group, a carbazolyl group, a dibenzofuranyl group, a dibenzothienyl group, a phenanthrolinyl group, an acridinyl group, a chrysenyl group, a fluoranthenyl group, a benzofluoranthenyl group, and the like. From the point of view of supplying charge shift to the benzopyridoindole derivative, $Ar^2$ is more preferably an aromatic hydrocarbon group including at least three rings, a condensed polycyclic aromatic group including at least three rings, a dibenzothienyl group, a carbazolyl group, a phenanthrolinyl group, or a dibenzofuranyl group, still more preferably an aromatic hydrocarbon group including at least three rings or a condensed polycyclic aromatic group including at least three rings, and especially preferably an anthracenyl group. The anthracenyl group may be unsubstituted or substituted. It is preferred that the anthracenyl group contains a substituent.

The substituent that may be contained in $Ar^2$ is preferably an aromatic hydrocarbon group, a condensed polycyclic aromatic group or an aromatic heterocyclic group (for example, a phenyl group, a biphenylyl group, a terphenylyl group, a tetrakisphenyl group, a styryl group, a naphthyl group, an anthracenyl group, an acenaphthenyl group, a phenanthrenyl group, a fluorenyl group, an indenyl group, a pyrenyl group, a pyridyl group, a triazinyl group, a pyrimidinyl group, a furyl group, a pyrollyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, or an acridinyl group). The substituent that may be contained in $Ar^2$ is more preferably a phenyl group, a biphenylyl group, a naphthyl group, a phenanthrenyl group, a fluorenyl group, a pyridyl group, a triazinyl group, a pyrimidinyl group, a quinolyl group, an isoquinolyl group, a dibenzofuranyl group, or a dibenzothienyl group. From the point of view of supplying charge shift to the benzopyridoindole derivative, the substituent that may be contained in $Ar^2$ is especially preferably a phenyl group or a naphthyl group.

$R^1$ through $R^9$ are each preferably an alkyl group having a carbon number of 1 through 6 or a hydrogen atom. It is especially preferred that all of $R^1$ through $R^9$ are each a hydrogen atom because it is easy to synthesize.

Among W, X, Y and Z, it is preferred that Y is a nitrogen atom.

Conventionally, in the case where a light emitting dopant material and an assist dopant material are used for the light emitting layer, the light emitting dopant material, the assist dopant material and the host material are merely vapor-deposited from the three sources. Therefore, the molecules of these materials are randomly dispersed in a molecule. As a result, many light emitting dopant molecules that do not contribute to light emission are present in the organic light emitting layer 114. Therefore, the light emitting color is not stable, and the color shift is caused.

FIG. 3A and FIG. 3B are each an enlarged view of the organic EL element 122 of the organic EL display device 100 according to an embodiment of the present invention shown in FIG. 2. FIG. 3A is a cross-sectional view of the organic EL element 122 according to an embodiment of the present invention. As shown in FIG. 3A, a light emitting dopant material 11 has a first concentration distribution in a thickness direction of the organic light emitting layer 114. An assist dopant material 13 has a second concentration distribution in the thickness direction of the organic light emitting layer 114. The assist dopant material 13 is distributed in the entirety of the organic light emitting layer 114. The first concentration distribution of the light emitting dopant material 11 has a concentration peak in a range of the second concentration distribution of the assist dopant material 13. It is preferred that the first concentration distribution of the light emitting dopant material 11 is in a narrower range than the range of the second concentration distribution of the assist dopant material 13. The light emitting dopant material 11 has such a concentration distribution, so that the amount of the light emitting material 11 used to dope the organic light emitting layer 114 is decreased.

In this embodiment, it is preferred the first concentration distribution of the light emitting dopant material 11 has a concentration peak at a peak emission position, at which the density of holes and electron is highest in the thickness direction of the light emitting layer 114. The light emitting dopant material 11 and the assist dopant material 13 each have such a concentration distribution, so that the precision of the emission position is increased, the light emission chromaticity is stabilized, the efficiency of the dopant energy transfer is improved, and the color shift is suppressed. The assist dopant material 13 may be distributed uniformly in the thickness direction of the organic light emitting layer 114, but it is preferred that the second concentration distribution of the assist dopant material 13 has a concentration peak at the peak emission position, at which the density of the holes and the electron is highest in the thickness direction of the light emitting layer 114. The concentration peak of the first concentration distribution of the light emitting dopant material 11 and the concentration peak of the second concentration distribution of the assist dopant material 13 both overlap the peak emission position in the thickness direction of the light emitting layer 114, so that precision of the emission position is increased, and the light emission efficiency is improved.

FIG. 3B is a cross-sectional view of the organic EL element 122 according to another embodiment of the present invention. As shown in FIG. 3B, the light emitting dopant material 11 has a first concentration distribution in the thickness direction of the organic light emitting layer 114. The assist dopant material 13 has a second concentration distribution in the thickness direction of the organic light emitting layer 114. The assist dopant material 13 is localized in a part of the thickness direction of the organic light emitting layer 114. The first concentration distribution of the light emitting dopant material 11 has a concentration peak in a range of the second concentration distribution of the assist dopant material 13. It is preferred that the first concentration distribution of the light emitting dopant material 11 is in a narrower range than the range of the second concentration distribution of the assist dopant material 13. The light emitting dopant material 11 and the assist dopant material 13 each have such a concentration distribution, so that the amount of the light emitting material 11 and the amount of the assist dopant material 13 used to dope the organic light emitting layer 114 are decreased.

In this embodiment, it is preferred the first concentration distribution of the light emitting dopant material 11 has a concentration peak at a peak emission position, at which the density of holes and electron is highest in the thickness direction of the light emitting layer 114. The light emitting dopant material 11 and the assist dopant material 13 each have such a concentration distribution, so that the precision of the emission position is increased, the light emission chromaticity is stabilized, the efficiency of the dopant energy transfer is improved, and the color shift is suppressed. In this embodiment, it is preferred that the second concentration distribution of the assist dopant material 13 has a concentration peak at the peak emission position, at which the density of the holes and the electron is highest in the thickness direction of the light emitting layer 114. For example, the first and second concentration distributions may each have a concentration peak on the side closer to the first organic layer 111 than to a center of the organic light emitting layer 114. In the organic EL display device 100, the peak emission position, at which the density of the holes and the electron is the highest is often located on the side closer to the first organic layer 111 than to a center of the organic light emitting layer 114. Since the light emitting dopant material 11 and the assist dopant material 13 respectively have such first and second concentration distributions, the precision of the emission position is increased and the light emission efficiency is improved.

A material usable for the pixel electrode 124 is selected from the group consisting of nickel, silver, gold, platinum, palladium, selenium, rhodium, ruthenium, iridium, rhenium, tungsten, molybdenum, chromium, tantalum, niobium, alloys thereof, tin oxide ($SnO_2$), indium tin oxide (ITO), zinc oxide, titanium oxide, and the like. The material usable for the pixel electrode 124 is not limited to any of the above. A material usable for the counter electrode 126 may be, for example, an alloy of an active metal material such as Li, Mg, Ca or the like and a metal material such as Ag, Al, In or the like, or a stack of such materials. A material usable for the counter electrode 126 is not limited to any of the above.

With reference to FIG. 4, the structure of the pixel 120 in the pixel unit 106 will be further described. The pixel 120 includes the organic EL element 122 and a transistor 132. A peripheral region of the pixel electrode 124 is covered with a bank layer 130, and the organic EL layer 125 is provided on a top surface of the pixel electrode 124 and continuously on a top surface of the bank layer 130. A region of the organic EL layer 125 that is located on the pixel electrode 124 corresponding to each color includes the organic light emitting layer 114, which is individually provided in each pixel 120. A sealing film 128 may be provided on a top surface of the organic EL element 122. The sealing film 128 is provided so as to cover substantially the entirety of the pixel unit 106.

In this embodiment, the organic EL display device 100, or the pixel 120, is of a top emission structure. Therefore, it is preferred that in the organic EL element 122, the counter electrode 126 is light-transmissive and the pixel electrode 124 has a light-reflective surface. The light emitted by the organic EL layer 125 radiates in all the directions, namely, $4\pi$ as represented by the solid angle. Therefore, the light radiating toward the second substrate 104 includes at least, in a mixed state, a light component directly radiating from the organic EL layer 125 and a light component reflected by the pixel electrode 124 and radiating toward the second substrate 104. Regardless of the type of light, the light emitted by the organic EL layer 125 is incident on the second substrate 104 at various angles.

The counter electrode 126 is supplied with a potential common to the plurality of pixels 120, and the level of the electric current flowing in the organic EL element 122 is controlled by the transistor 132. The level of the electric current flowing in the organic EL element 122 via the transistor 132 varies in accordance with the video signal, and the level of the electric current determines a potential difference between the counter electrode 126 and the pixel electrode 124.

The transistor 132 is a field effect transistor, in which a semiconductor layer 134 and a gate electrode 138 are insulated from each other by a gate insulating layer 136. Specifically, the transistor 132 is in the form of a thin film transistor, in which a channel is formed in the semiconductor layer 134, which is a thin film layer. It is preferred that an interlayer insulating layer 144 is provided between the transistor 132 and the organic EL element 122. The pixel electrode 124 is provided on the interlayer insulating layer 144, and is connected with a source/drain electrode 140 via a contact hole.

In the case where the organic EL element 122 emits white light, the second substrate 104 may have a light blocking layer 146, a color filter layer and an overcoat layer 150 provided thereon. Such a structure realizes color display.

(Production Method)

A method for producing the organic EL display device 100 according to an embodiment of the present invention will be described. The organic EL display device 100 may be produced by a known method.

First, the pixel circuit is formed on the first substrate 102. In this step, the scanning line driving circuit 162, the video signal line driving circuit 164, the input terminal portion 166 and the like are optionally formed. Components included in the pixel circuit, for example, the transistor 132, a capacitor and the like are formed by repeating a step of stacking thin films of a semiconductor material, an insulating material and a metal material and a step of patterning by use of photolithography.

On a circuit element layer 158 including the pixel circuit and the like, the organic EL element 122 is formed. For forming the organic EL element 122 in each pixel 120, the pixel electrode 124 electrically connected with the pixel circuit is formed. The pixel electrode 124 is formed on the interlayer insulating layer 144, which buries the transistor 132. Next, the bank layer 130 covering the peripheral region of the pixel electrode 124 is formed. The pixel electrode 124 is formed for each pixel 120 and is surrounded by the bank layer 130. Thus, the area of each pixel 120 is defined.

The first organic layer 111, the electron blocking layer 112, the organic light emitting layer 114, the hole blocking layer 115 and the second organic layer 116 are formed on the pixel electrode 124. These layers may be formed by, for example, vapor deposition or by printing by use of ink-jetting. In an embodiment, the hole injection layer may be formed between the pixel electrode 124 and the first organic layer 111, and the electron injection layer may be formed between the counter electrode 126 and the second organic layer 116. As a result, the organic EL layer 125 is formed.

The organic light emitting layer 114 may be formed by vapor deposition of a required host material appropriately selected from the above-described hole transfer-type materials, the above-described electron transfer-type materials, and materials capable of transferring both of holes and electrons, and also a light emitting dopant material and an assist dopant material selected in accordance with the color of the corresponding pixel.

The organic light emitting layer 114 shown in FIG. 3A is formed as follows. First, the host material and the light emitting dopant material are deposited to a predetermined thickness by two-component vapor deposition or printing by use of ink-jetting. Then, the host material, the light emitting dopant material and the assist dopant material are deposited to a predetermined thickness by three-component vapor deposition or printing by use of ink-jetting. In a final step, the host material and the light emitting dopant material are deposited to a predetermined thickness by two-component vapor deposition or printing by use of ink-jetting. Thus, the organic light emitting layer 114 is formed. Such formation of the organic light emitting layer 114 may be performed for each of the pixels 120 with different colors.

The organic light emitting layer 114 shown in FIG. 3B is formed as follows. First, the host material is deposited to a predetermined thickness by vapor deposition or printing by use of ink-jetting. Then, the host material and the assist dopant material are deposited to a predetermined thickness by two-component vapor deposition or printing by use of ink-jetting. Then, the host material, the light emitting dopant material and the assist dopant material are deposited to a predetermined thickness by three-component vapor deposition or printing by use of ink-jetting. Next, the host material and the assist dopant material are deposited to a predetermined thickness by two-component vapor deposition or printing by use of ink-jetting. In a final step, the host material is deposited to a predetermined thickness by vapor deposition or printing by use of ink-jetting. Thus, the organic light emitting layer 114 is formed. Such formation of the organic light emitting layer 114 may be performed for each of the pixels 120 with different colors.

Then, the counter electrode 126 is formed. On a top surface of the counter electrode 126, the sealing film 128 is formed of a silicon nitride film or the like. In this manner, the pixel circuit and the pixel unit 106 are formed.

What is claimed is:

1. An electroluminescence display device, comprising:
a pixel electrode;
a first organic layer provided on the pixel electrode;
a light emitting layer provided on the first organic layer, the light emitting layer including a host material, a light emitting dopant material and an assist dopant material;
a second organic layer provided on the light emitting layer; and
a counter electrode provided on the second organic layer, wherein
the light emitting dopant material has a first concentration distribution in a thickness direction of the light emitting layer,
the assist dopant material has a second concentration distribution in the thickness direction of the light emitting layer, and
the first concentration distribution has a concentration peak in a range of the second concentration distribution.

2. The electroluminescence display device according to claim 1, wherein a range of the first concentration distribution is narrower than the range of the second concentration distribution.

3. The electroluminescence display device according to claim 1, wherein the first concentration distribution has the concentration peak on a side closer to the first organic layer than to a center of the light emitting layer, and the second concentration distribution has a concentration peak on a side closer to the first organic layer than to the center of the light emitting layer.

4. The electroluminescence display device according to claim 1, wherein the concentration peak of the first concentration distribution and a concentration peak of the second concentration distribution overlap each other.

5. The electroluminescence display device according to claim 1, wherein
the first organic layer includes a hole transfer layer,
the second organic layer includes an electron transfer layer, and
the first organic layer is thicker than the second organic layer.

6. The electroluminescence display device according to claim 1, further comprising:
an electron blocking layer between the first organic layer and the light emitting layer; and
a hole blocking layer between the light emitting layer and the second organic layer.

* * * * *